United States Patent [19]

Young

[11] Patent Number: 5,757,794

[45] Date of Patent: May 26, 1998

[54] DIGITAL DOWN CONVERTER AND METHOD

[75] Inventor: William Ronald Young, Palm Bay, Fla.

[73] Assignee: Harris Corporation, Melbourne, Fla.

[21] Appl. No.: 478,682

[22] Filed: Jun. 7, 1995

Related U.S. Application Data

[62] Division of Ser. No. 930,170, Aug. 14, 1992, Pat. No. 5,493,581.

[51] Int. Cl.$^6$ .................................................. H04J 3/00
[52] U.S. Cl. ........................................ 370/362; 395/287
[58] Field of Search ................................ 370/362, 363, 370/364, 365, 438, 451, 458, 462, 489, 490; 395/280, 287, 297, 304; 326/56; 375/257, 286, 288

[56] References Cited

U.S. PATENT DOCUMENTS

| | | | |
|---|---|---|---|
| 4,313,033 | 1/1982 | Walker et al. | 370/259 |
| 4,485,467 | 11/1984 | Miles et al. | 370/220 |
| 4,511,969 | 4/1985 | Koenig et al. | 364/222.2 |
| 4,868,780 | 9/1989 | Stern | 395/892 |
| 4,949,334 | 8/1990 | Bernhardt | 370/463 |
| 5,088,089 | 2/1992 | Gingell et al. | 370/363 |
| 5,237,563 | 8/1993 | McNulty | 370/359 |
| 5,410,542 | 4/1995 | Gerbehy et al. | 370/364 |

*Primary Examiner*—Alpus H. Hsu
*Assistant Examiner*—Kwang Bin Yao
*Attorney, Agent, or Firm*—Rogers & Killeen

[57] ABSTRACT

A digital down converter with a programmable mixing down frequency and a programmable extraction bandwidth uses a ROM based sin/cos generator plus a programmable high decimation filter followed by a gain compensating scaling multiplier and a fixed FIR filter. Output format options are also programmable, and programming commands are serially loaded into registers. Various components may be isolated for efficient testing and also subsystem operation.

12 Claims, 29 Drawing Sheets

CONTROL WORD 0 FORMAT

| BIT POSITION | FUNCTION | DESCRIPTION |
|---|---|---|
| 39-37 | TYPE | 000 = CONTROL WORD 0 |
| 36 | UPDATE | 0 = NO CONTROL REGISTER UPDATE |
|  |  | 1 = CONTROL REGISTER UPDATE |
| 35-0 | UNUSED |  |

CONTROL WORD 1 FORMAT

| BIT POSITION | FUNCTION | DESCRIPTION |
|---|---|---|
| 39-37 | TYPE | 001=CONTROL WORD 1 |
| 36 | UPDATE | 0=NO CONTROL REGISTER UPDATE |
|  |  | 1=CONTROL REGISTER UPDATE |
| 35-4 | MIN. PHASE INCREMENT | MINIMUM PHASE INCREMENT BITS 35-4=$2^{31}...2^0$ |
| 3 | TEST ENABLE | 0=TEST FEATURES DISABLED |
|  |  | 1=TEST FEATURES ENABLED |
| 2-0 | MODE | 000=NORMAL MODE |
|  |  | 001=RESERVED MODE |
|  |  | 0xx=RESERVED MODES |
|  |  | 100=UP CHIRP MODE |
|  |  | 101=DOWN CHIRP MODE |
|  |  | 110=UP/DOWN CHIRP MODE |
|  |  | 111=HIGH DECIMATION FILTER MODE |

FIG. 23

CONTROL WORD 2 FORMAT

| BIT POSITION | FUNCTION | DESCRIPTION |
|---|---|---|
| 39-37 | TYPE | 010=CONTROL WORD 2 |
| 36 | UPDATE | 0=NO CONTROL REGISTER UPDATE |
| | | 1=CONTROL REGISTER UPDATE |
| 35-21 | DECIMATION RATE | 15 BIT HDF DECIMATION NUMBER=DECIMATION-1. MINIMUM ALLOWABLE VALUE =15. BITS 35-21=$2^{14}...2^{0}$ |
| | | DECIMATE BY 32,768: BITS 35-21= ALL ONES |
| 20-5 | GAIN COMPENSA- | 16 BIT GAIN COMPENSATION NUMBER WITH VALUES BETWEEN 1 AND 2, 2 NON INCLUSIVE. BITS 20-5=$2^{0}$ $2^{-1}..2^{-15}$ |
| 4-3 | OUTPUT FORMAT | 00=TWO'S COMPLEMENT |
| | | 01=UNSIGNED |
| | | 10=SIGN MAGNITUDE |
| | | 11=IEEE SINGLE PRECISION FLOATING POINT FORMAT |
| 2-1 | ROUND | 00=ROUND TO 16 BITS |
| | | 01=ROUND TO 24 BITS |
| | | 10=ROUND TO 32 BITS |
| | | 11=38 BITS |
| 0 | OUTPUT SENSE | 0=LSB FIRST |
| | | 1=MSB FIRST |

FIG. 24

CONTROL WORD 3 FORMAT

| BIT POSITION | FUNCTION | DESCRIPTION |
|---|---|---|
| 39-37 | TYPE | 011=CONTROL WORD 3 |
| 36 | UPDATE | 0=NO CONTROL REGISTER UPDATE |
|  |  | 1=CONTROL REGISTER UPDATE |
| 35-18 | DELTA PHASE INCREMENT | 18 BIT DELTA PHASE INCREMENT |
|  |  | BITS 35-18=$2^{17}...2^0$ |
| 17-9 | GROWTH BITS RATE | 9 GROWTH BITS CONTROL THE HDF DATA SHIFTER |
|  |  | BITS 17-9=$2^8...2^0$ |
| 8-0 | RESERVED |  |

FIG. 25

CONTROL WORD 4 FORMAT

| BIT POSITION | FUNCTION | DESCRIPTION |
|---|---|---|
| 39-37 | TYPE | 100=CONTROL WORD 4 |
| 36 | UPDATE | 0=NO CONTROL REGISTER UPDATE |
|  |  | 1=CONTROL REGISTER UPDATE |
| 35-18 | PHASE OFFSET | BITS 35-18=$2^{17}...2^0$ |
| 17-5 | I/Q CLOCK RATE | 13 BIT I/Q CLOCK RATE |
|  |  | BITS 17-5=$2^{12}...2^0$ |
| 4-0 | RESERVED |  |

FIG. 26

CONTROL WORD 5 FORMAT

| BIT POSITION | FUNCTION | DESCRIPTION |
|---|---|---|
| 39-37 | TYPE | 101 = CONTROL WORD 5 |
| 36 | UPDATE | 0 = NO CONTROL REGISTER UPDATE |
| | | 1 = CONTROL REGISTER UPDATE |
| 35-30 | RESET DELAY | RESET DELAY, BITS 35-30 = $2^5...2^0$ |
| 29 | I/Q CLOCK POLARITY | CHANGES THE I/Q CLOCK'S POLARITY |
| | | 0 = LOW ACTIVE |
| | | 1 = HIGH ACTIVE |
| 28 | I/Q CLOCK DUTY CYCLE | CHANGES THE I/Q CLOCK'S DUTY CYCLE |
| | | 0 = ACTIVE 1 CLOCK PERIOD PRIOR TO THE BITS END |
| | | 1 = ACTIVE THE LAST HALF OF THE BIT PERIOD |
| 27 | I/Q CLOCK DURATION | 0 = ACTIVE DURING I OR Q BIT PERIODS ONLY |
| | | 1 = ACTIVE CONTINUOUSLY |
| 26-25 | I/Q CLOCK TRI-STATE CONTROL | 00 = TRI-STATE I/Q CLOCK |
| | | 01 = I/Q ENABLE I/Q CLOCK |
| | | 1x = AUTO-TRI-STATE ENABLE I/Q CLOCK |
| 24 | I/Q STROBE POLARITY | CHANGES THE I/Q STROBE'S POLARITY |
| | | 0 = LOW ACTIVE |
| | | 1 = HIGH ACTIVE |
| 23 | I/Q STROBE LOCATION | 0 = I/Q STROBE PRIOR TO THE BEGINNING OF THE DATA WORD |
| | | 1 = I/Q STROBE DURING THE DATA WORD |
| 22 | I/Q STROBE WIDTH | 0 = ONE CLOCK PERIOD |
| | | 1 = ONE I/Q CLOCK PERIOD |
| 21-20 | I/Q STROBE TRI-STATE CONTROL | 00 = TRI-STATE I/Q STROBE |
| | | 01 = I/Q ENABLE I/Q STROBE |
| | | 1x = AUTO-TRI-STATE ENABLE I/Q STROBE |
| 19 | I POLARITY | CHANGES THE I OUTPUT'S POLARITY |
| | | 0 = 1 HIGH ACTIVE |
| | | 1 = 1 LOW ACTIVE |
| 18 | I TRI-STATE CONTROL | 00 = TRI-STATE I |
| | | 01 = I/Q ENABLE I |
| | | 1x = AUTO-TRI-STATE ENABLE I |
| 17 | Q POLARITY | CHANGES THE Q OUTPUT'S POLARITY |
| | | 0 = 1 HIGH ACTIVE |
| | | 1 = 1 LOW ACTIVE |
| 16-15 | Q TRI-STATE CONTROL | 00 = TRI-STATE Q |
| | | 01 = I/Q ENABLE Q |
| | | 1x = AUTO-TRI-STATE ENABLE Q |
| 14 | INPUT FORMAT | 0 = TWO'S COMPLEMENT |
| | | 1 = UNSIGNED |
| 12-0 | RESERVED | |

FIG. 27

CONTROL WORD 6 FORMAT

| BIT POSITION | FUNCTION | DESCRIPTION |
|---|---|---|
| 39-37 | TYPE | 110 = CONTROL WORD 6 |
| 36 | UPDATE | 0 = NO CONTROL REGISTER UPDATE |
| | | 1 = CONTROL REGISTER UPDATE |
| 35-4 | MAX. PHASE INCREMENT | MAXIMUM PHASE INCREMENT BITS 35-4 = $2^{31}...2^0$ |
| 3-0 | RESERVED | |

FIG. 28

CONTROL WORD 7 FORMAT

| BIT POSITION | FUNCTION | DESCRIPTION |
|---|---|---|
| 39-37 | TYPE | 111 = CONTROL WORD 7 |
| 36 | UPDATE | 0 = NO CONTROL REGISTER UPDATE |
| | | 1 = CONTROL REGISTER UPDATE |
| 35 | DATA | 0 = NORMAL DATA INPUT |
| | | 1 = DATA INPUT = 1000 HEX |
| 34-33 | FIR ACCUMULATOR | 00 = NORMAL ACCUMULATION |
| | | 01 = NO ACCUMULATION |
| | | 10 = CONTINUOUS ACCUMULATION |
| | | 11 = SIGNATURE REGISTER |
| 32 | Q STROBE ON ROLL OVER | 0 = NORMAL STROBE |
| | | 1 = STROBE WHEN PHASE GENERATOR ROLLS OVER |
| 31 | FORCE OUTPUTS | 0 = NORMAL OUTPUT RESPONSE |
| | | 1 = FORCE OUTPUTS |
| 30 | I/Q CLOCK | FORCE I CLOCK = BIT 30 IF BIT 31 = 1, ELSE NORMAL |
| 29 | I/Q STROBE | FORCE Q STROBE = BIT 29 IF BIT 31 = 1, ELSE NORMAL |
| 28 | I | FORCE I = BIT 28 IF BIT 31 = 1, ELSE NORMAL |
| 27 | Q | FORCE Q = BIT 27 IF BIT 31 = 1, ELSE NORMAL |
| 26-20 | BYPASS | IF BIT 26 = 0 PHASE GENERATOR NORMAL, IF BIT26 = 1 BYPASS |
| | | IF BIT 25 = 0 HDF INTEGRATOR NORMAL, IF BIT 25 = 1 BYPASS |
| | | IF BIT 24 = 0 HDF DECIMATOR NORMAL, IF BIT 24 = 1 BYPASS |
| | | IF BIT 23 = 0 HDF COMB NORMAL, IF BIT 23 = 1 BYPASS |
| | | IF BIT 22 = 0 SCALER MULTIPLIER NORMAL, IF BIT 22 = 1 BYPASS |
| | | IF BIT 21 = 0 RAM NORMAL, IF BIT 21 = 1 BYPASS |
| | | IF BIT 20 = 0 FIR MULTIPLIER NORMAL, IF BIT 20 = 1 BYPASS |
| 19-0 | RESERVED | |

DIGITAL DOWN CONVERTER AND METHOD

CROSS-REFERENCE TO RELATED APPLICATIONS

This is a division, of application Ser. No. 07/930,170, filed Aug. 14, 1992, now U.S. Pat. No. 5,493,581.

The following U.S. patents and patent applications are assigned to the assignee of this application and disclose subject matter which may be related: Allowed application Ser. No. 930,072, filed Aug. 14, 1992, "Quadrature Filter With Real Conversion"; U.S. Pat. No. 5,455,782, filed Aug. 14, 1992, "Decimation Filter and Method"; Allowed application Ser. No. 304,433 filed Sep. 12, 1994 (which is a continuation of abandoned application Ser. No. 930,167, filed Aug. 14, 1992), "Half-Band Filter and Method"; U.S. Pat. No. 5,440,506, filed Aug. 14, 1992, "Multiport Memory and Method"; and U.S. Pat. No. 5,276,633, issued Jan. 4, 1994, "Sin/Cosine Generator and Method". These cross-referenced applications are hereby incorporated by reference.

BACKGROUND AND SUMMARY OF THE INVENTIONS

The present invention relates to electronic devices, and, more particularly, to semiconductor circuits and methods useful for extracting subband information from broadband digital data streams.

Digital Systems with Down Converters

Communications systems such broadcast radio use frequency division multiplexing (FDM) to simulaneously transmit differing information signals from several sources in a single locale. Typically, each source modulates its carrier frequency with its information signal and keeps within its allocated frequency band. Extraction of a desired information signal from a received broadband of simultaneous broadcasts may be performed by mixing down (down conversion by the selected carrier frequency) followed by lowpass filtering and demodulation as schematically illustrated by system 100 in FIG. 1. Indeed, system 100 receives radio frequency signals (e.g., 100–200 MHz) at antenna 102, filters and mixes the signals down to intermediate frequencies (e.g., 1–10 MHz) with a wideband tuner 104, converts from analog to digital format with sampling analog-to-digital converter 106, extracts the selected frequency band (e.g., of width 5 KHz) with digital down converter 108 which performs the down conversion and filtering, and demodulates and reconstructs an analog information signal with demodulator/processor 110. For example, if wideband tuner 104 has a 10 MHz output bandwidth, then analog-to-digital converter 106 will sample at 20 MHz or more (at least the Nyquist rate), and digital down converter 108 will output a 5 KHz selected band at a sampling rate of 10 KHz. That is, digital down converter 108 may decrease the sampling rate due to the small bandwidth of its output without loss of information.

The problems of construction of system 100 include realizing digital down converter 108 operating at a high sampling frequency while maintaining a low ripple sharp cutoff filter which has programmable down conversion frequency and programmable bandwidth. Known realizations of a down conversion function include the combination of a numerically controlled oscillator/modulator (NCOM) such as the HSP45106 manufactured by Harris Corporation together with two decimating digital filters (one for the in-phase and one for the quadrature outputs of the NCOM) such as the HSP43220 also manufactured by Harris Corporation. A single chip realization such as the GC1011 digital reciver chip manufactured by Graychip, Inc.

Another example with digital down conversion is a long distance telephone system which may encode multiple voice channels in an FDM format for long distance transmission but convert this to a time division multiplexed (TDM) format for digital switching. FIG. 2a illustrates FDM to TDM system 200 with analog-to-digital converter 202 feeding a bank of digital down converters 204 whose outputs are time multiplexed by trunk formatter 206. FIG. 2b shows the frequency domain operation of system 200 where each of the digital down converters 204 extracts one of the voice channels. Again, the problems of system 200 include realization of a digital down converter with high frequency operation together with low ripple sharp cutoff filter. Multistage finite impluse response filters could be used but involve excessive amounts of hardware for more than minimal precision and frequency range.

Crochiere and Rabiner, Multirate Digital Signal Processing (Prentice-Hall 1983) provides general information regarding signal processing using sampling rate changes. Hogenauer, An Economical Class of Digital Filters for Decimation and Interpolation, 29 IEEE Tr.Ac.Sp.Sig.Proc. 155 (1981) discloses decimation filters made of an integrator section followed by a differencing comb section operating at a low sampling

Features

The present invention provides a digital down converter with a programmable down conversion frequency, programmable bandwidth, programmable output format, serial control word format, and multichip module compatibility.

BRIEF DESCRIPTION OF THE DRAWINGS

The present invention will be described with reference to the accompanying drawings, which are schematic for clarity:

FIGS. 20–21 are schematic diagrams for the formatter;

FIGS. 22–29 show control words; and

DESCRIPTION OF THE PREFERRED EMBODIMENTS

Functional Overview

Figure 3:
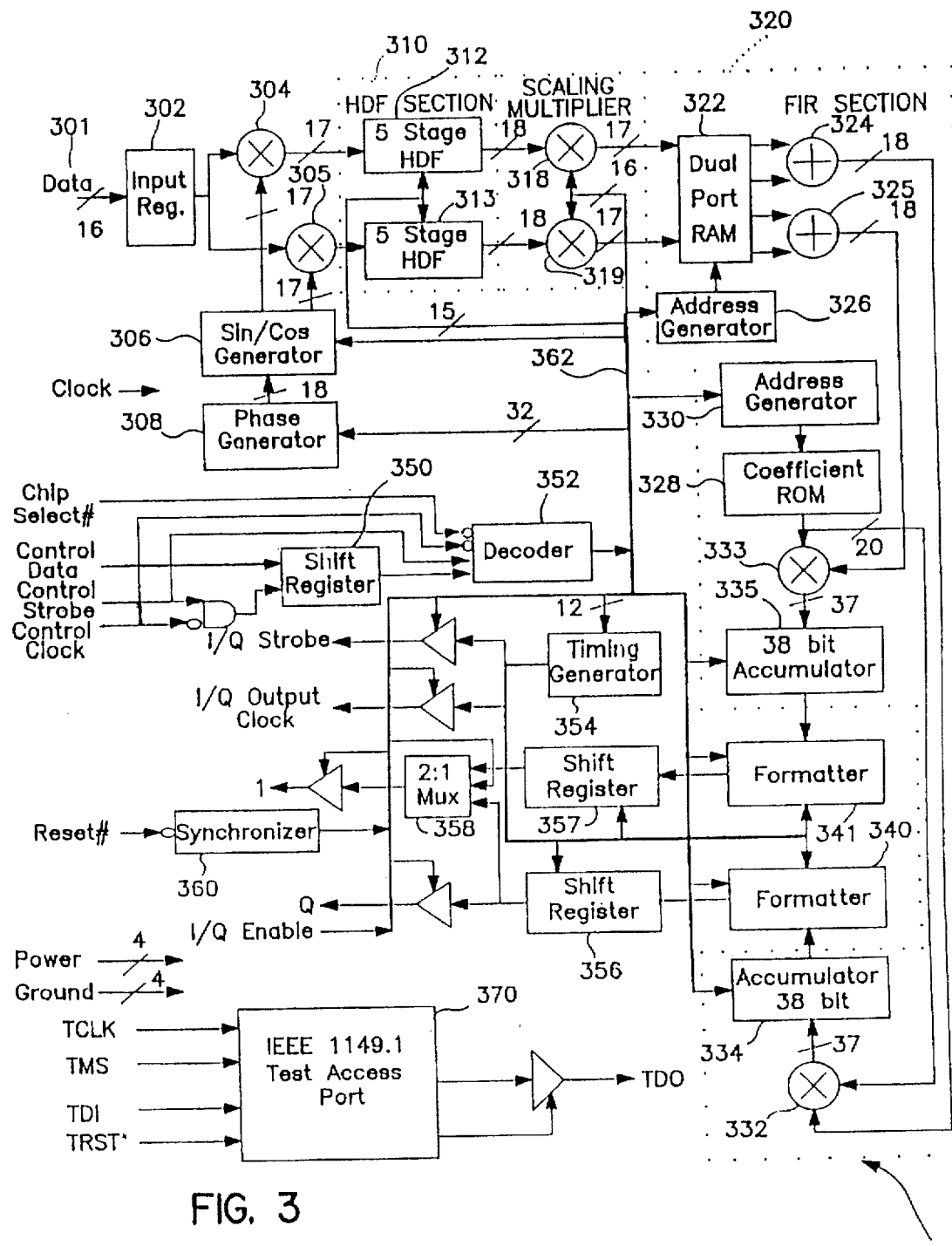
FIG. 3 is a functional block diagram of a first preferred embodiment digital down converter.

FIG. 3 is a functional block circuit diagram of a first preferred embodiment single chip digital down converter which operates to extract a selected narrow band from a broadband digital input as follows. A stream of real 16-bit digital data samples is first shifted down in frequency through multiplication by a complex exponential with a selected frequency centered in the narrow band. The data is in two's complement or offset binary format. The preferred embodiment performs the complex multiplication by separate real part and imaginary part multiplications; that is, multiplications by a cosine with the selected frequency and by a sine with the selected frequency, respectively. The upper lefthand portion of FIG. 3 illustrates a phase generator providing the selected frequency phase and a sin/cos generator transforming the phase to cosines and sines.

After the multiplications the real and imaginary parts are each lowpass filtered to extract the frequency band of interest and this yields in-phase and quadrature data streams. The lowpass filtering has three stages: first a high decimation filter which decimates (reduces) the sampling rate but has a broad transition between passband and stopband, second a multiplication to adjust the overall gain of the lowpass filtering to 1, and third a fixed lowpass filter with a sharp transition from passband to stopband. The sampling frequency may be decimated because the Nyquist theorem implies narrow band information may be recovered from samples with a lower sampling rate than broadband information. Indeed, the bandwidth of the narrow band determines the decimation rate applicable, and the high decimation filter has a programmable decimation rate which may vary in the range of 16 to 32,768. Such a decimated sampling rate also simplifies subsequent hardware. The high decimation filter and the multipliers to adjust the gain appear in the upper center portion of FIG. 3; and the fixed lowpass filter occupies the righthand portion of FIG. 3.

A formatter follows the lowpass filter and provides for various output formats: the in-phase and quadrature as separate two's complement or offset binary format data streams with selectable numbers of bits, a floating point format, a single real output format where the output comes from a combination of the in-phase and quadrature data streams shifted by half the output sampling rate, and spectrally reversed data variations of these listed formats.

Programmable items such as the decimation rate, the overall lowpass filtering gain adjustment, and the desired output format are selected by loading appropriate control words into the decoder illustrated in the center portion of FIG. 3.

Architectural Overview

FIG. 3 shows the first preferred embodiment digital down converter, generally denoted by reference numeral 300, as including the following blocks and items: 16-bit parallel port 301; 16-bit input register 302 for latching samples of a digital data stream input at parallel port 301; 16-bit by 17-bit real multipliers 304–305 and 17-bit sin/cos generator 306 for mixing down the data stream; phase generator 308 to drive sin/cos generator 306; high decimation filter section 310 which includes programmable 5-stage high decimation filters 312–313 for lowpass filtering the mixed down data streams and decimating (reducing) their sampling rate; 18-bit real scaling multipliers 318–319 to compensate for the decimation filter gain; finite impulse response (FIR) filter section 320 for final shaping of the frequency response of the decimation filters and which includes dual port RAM 322, 17-bit real adders 324–325, address generator 326 for RAM 322, coefficient ROM 328, address generator 330 for ROM 328, 17-bit by 20-bit real multipliers 332–333, and 38-bit accumulators 334–335; formatters 340–341 for selection of the output format; 40-bit control shift register 350 for holding control words; decoder 352 for control register 350; timing generator 354; in-phase output shift register 357; quadrature output shift register 356; 2:1 multiplexer 358; synchronizer 360; bus 362; output drivers for the output terminals; test access port 370; input parallel port Data, input terminals for Chip Select#, Control Data (serial port to register 350), Control Strobe, Control Clock, Clock, Power (four terminals), Ground (four terminals), Reset#, I/Q (in-phase/quadrature) Enable, TCLK (test clock), TMS (test mode select), TDI (test data input), TRST* (test reset*); and output terminals for I (in-phase) serial output, Q (quadrature) serial output, I/Q Strobe, I/Q Output Clock, and TDO (test data output). FIR section 320 actually has parallel I and Q branches.

Basically, 40-bit control words serially loaded into control register 350 provide the parameters for operation of converter 300. A clock running at the data stream sampling rate enters at the Clock input and drives (not explicitly shown) all of the blocks of converter 300 and provides the synchronization of the operation of the blocks. Decoder 352 decodes the control words and feeds the parameters to registers within the various blocks over bus 362. The parameters relate to items such as the bandwidth, increment size for phase generator 308, the decimation rate for the high decimation filters 310, and the output format. These parameters are interrelated; for example, the decimation rate varies inversely with the bandwidth, and the increment size depends upon both the down conversion frequency and the sampling frequency. Details of the structure and operation of these blocks and circuitry appears in following sections.

Operation Summary

Figure 1:
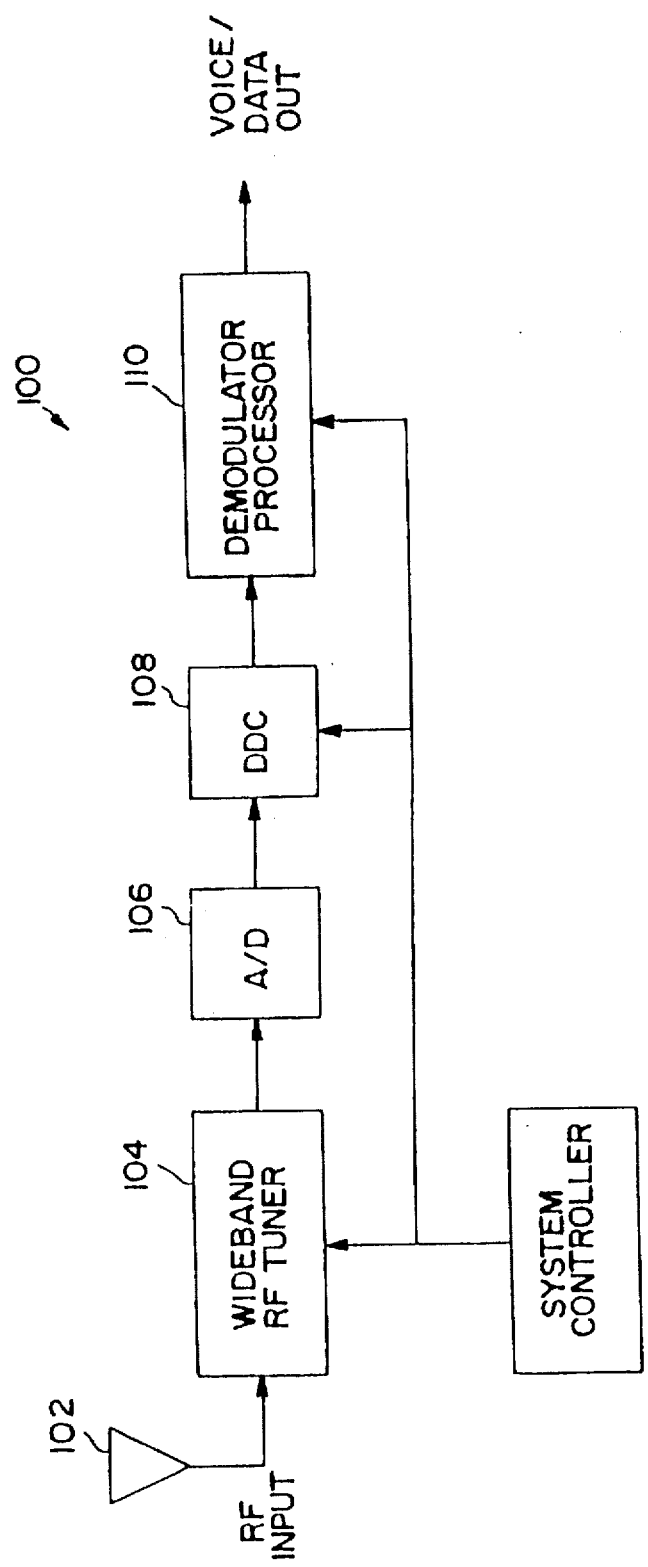
FIG. 1 illustrates a first application of a first preferred embodiment digital down converter.
Figure 4:
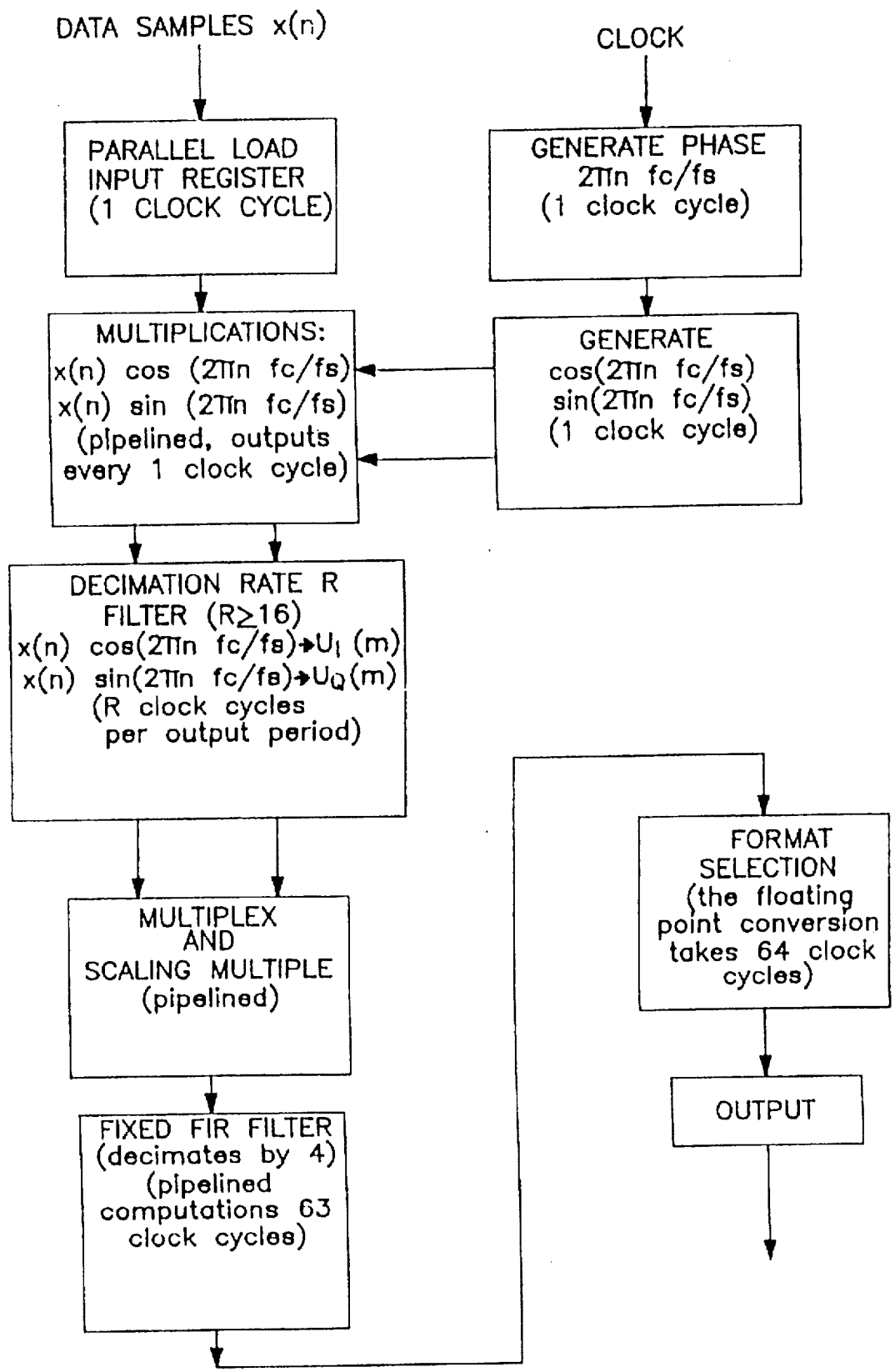
FIG. 4 is a flow chart of the overall operation of the first preferred embodiment.
Figure 5A:
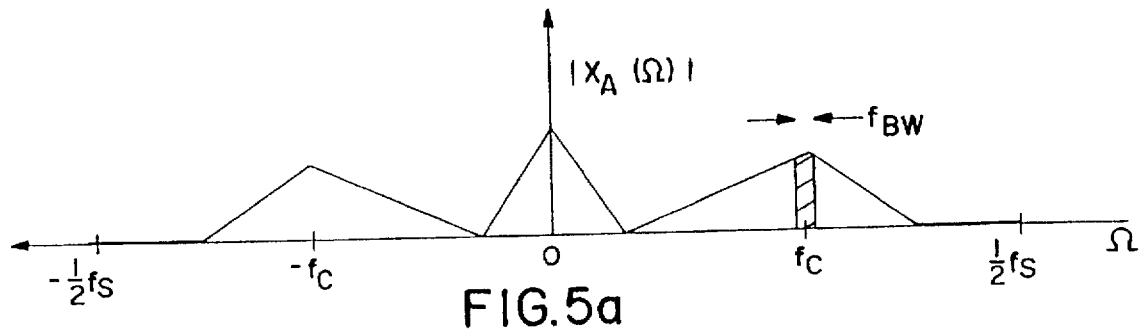
FIGS. 5a–j show the spectrum for various stages in the operation of the first preferred embodiment.
Figure 5B:
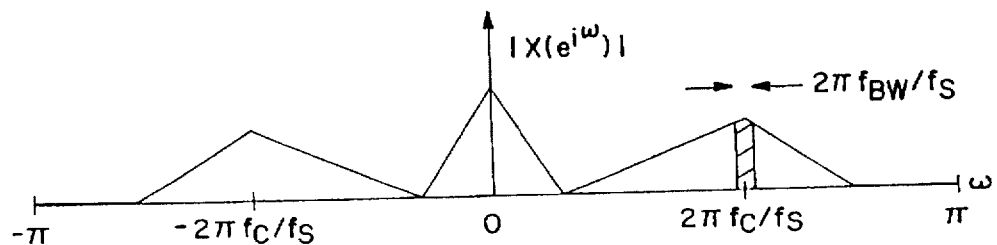
Figure 5C:
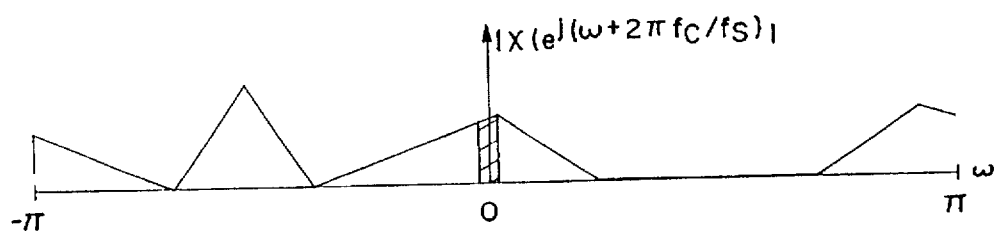
Figure 5D:
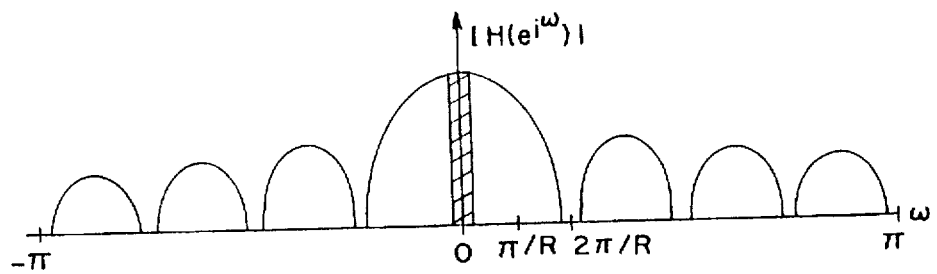
Figure 5E:
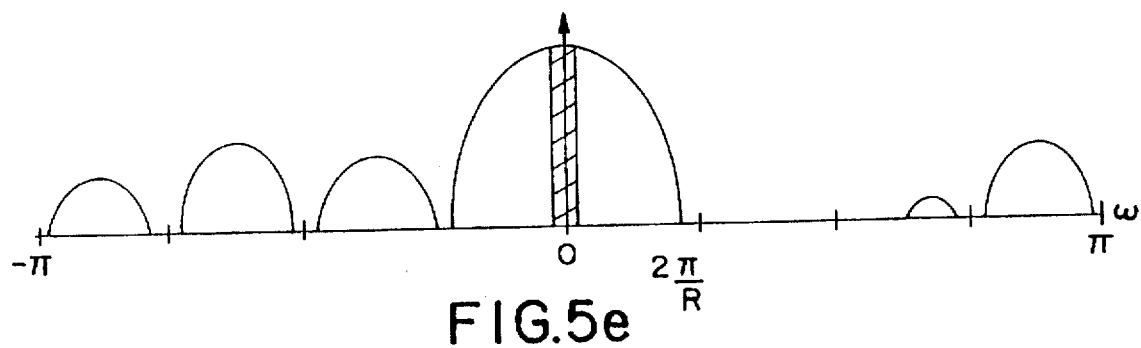
Figure 5F:
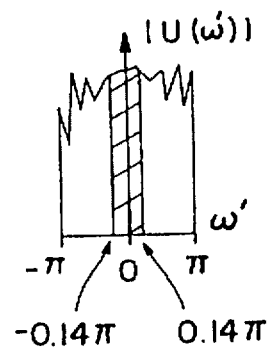

FIG. 4 is a flow chart illustrating the operation of converter 300 for extraction of a frequency band of width $f_{BW}$ centered at frequency $f_C$ from an input digital data stream which has a sampling frequency $f_S$. That is, the input data stream $x(n)$ may be (quantized) samples of an analog signal $x_A(t):x(n)=x_A(nT)$ where $T=1/f_S$ and $f_S$ is the sampling frequency. Exemplary values for multichannel voice communication over radio frequencies as illustrated in FIG. 1 could be $f_S$=50 MHz, $f_C$=10 MHz, and $f_{BW}$=4 KHz for a voice channel. FIG. 5a shows the spectrum (magnitude of the Fourier transform) of an illustrative simplified $x_A(t)$ and indicates its band limited nature (spectrum confined within $\pm f_S/2$) and the desired frequency band for extraction centered at $f_C$. Note that $x_A(t)$ being real-valued implies a conjugate symmetric Fourier transform. FIG. 5b shows the corresponding spectrum of the sample data stream $x(n)$ which is a function defined on the integers. Multipliers 304–305 modulate the incoming data stream $x(n)$ with a complex exponential stream of frequency $f_C$ (from sin/cos generator 306) to move the center frequency $f_C$ of the desired band to frequency 0; see FIG. 5c. Then the modulated data stream is lowpass filtered and the sampling frequency decimated by a factor of R in high decimation filter section 310. FIG. 5d illustrates the decimation filter section 310 frequency response magnitude in terms of the original sampling frequency for R=8. This small value of R simplifies the Figures, but converter 300 has R values in the range of 16 to 32,768 with the minimum decimation rate set by the computation time required in FIR section 320. FIG. 5d shows the broad transition from the passband (shaded about 0 frequency) to the stopbands (about $k2\pi/R$ for $k=\pm 1$, $\pm 2, \ldots$). FIG. 5e shows the spectrum of the filtered output, again in terms of the original sampling frequency variable $\omega$. FIG. 5f illustrates the spectrum of the filtered output in terms of the decimated sampling frequency variable $\omega'$ which corresponds to the sampling frequency $f_s/R$. Note that sampling rate decimation creates R-fold aliasing, but that the stopbands alias to the passband. Thus, the sampling rate decimation does not disturb the signal in the passband, but wreaks havoc outside of the passband as suggested by the rapid spectral variation shown in FIG. 5f. The 40-bit control words provide programming of the passband width and the decimation rate.

Figure 5J:
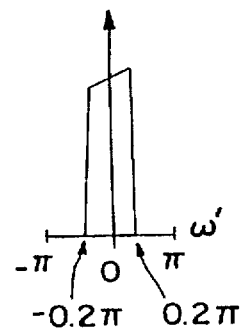
Figure 5G:
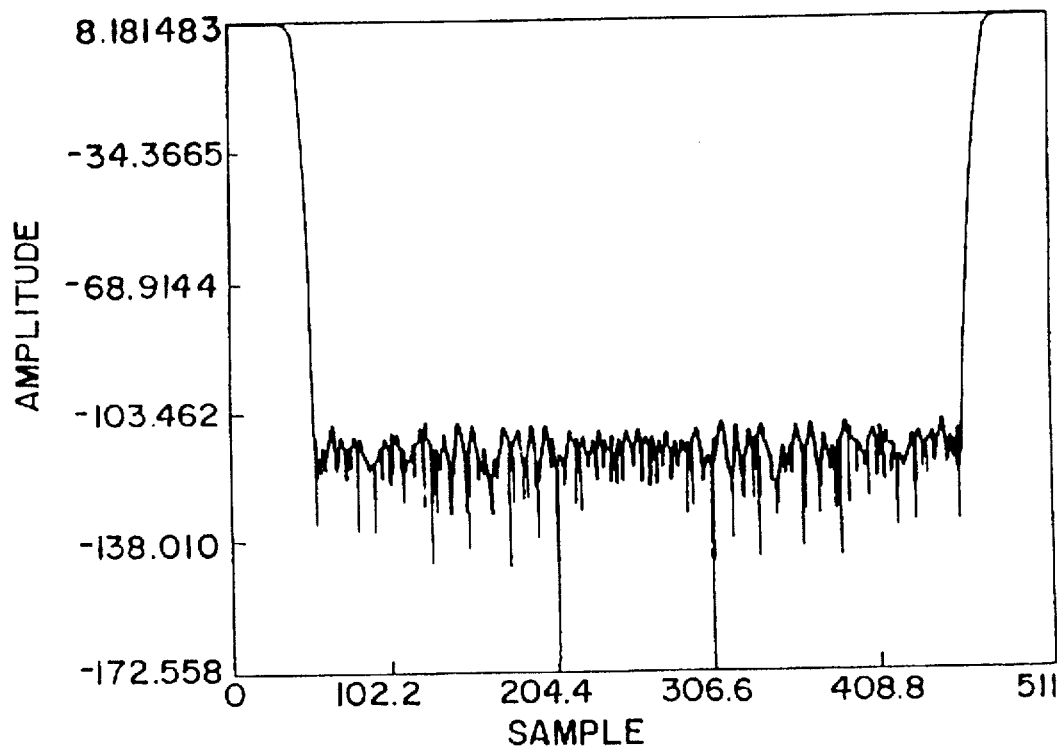
Figure 5H:
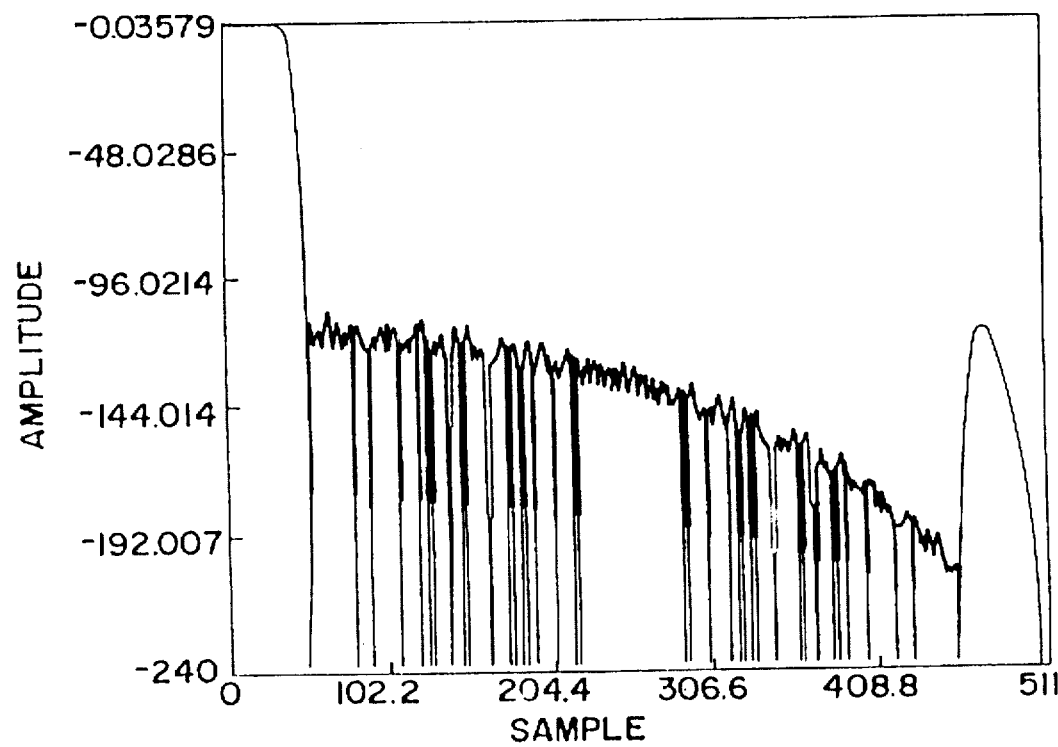

Scaling multipliers 318–319 compensate for the gain in the high decimation filter section 310. This gain lies in the range (0.5, 1.0]. FIR filter section 320 provides final spectral shaping plus additional decimation. FIG. 5g shows the magnitude (logarithmic scale) of the frequency response of FIR section 320. FIG. 5h shows the magnitude (logarithmic scale) of the response of the composite of FIR section 320 and high decimation filter section 310. Both FIGS. 5g and 5h use an expanded frequency scale and only show the portion corresponding to the interval 0 to $2\pi/R$ of FIG. 5d. The output can be further decimated due to the width of the passband.

Formatters 340–341 put the filtered and decimated data stream into the selected format: rounded to 16, 24, or 32 bits or the full 38 bits of the accumulators, or as IEEE single precision floating point. The information can be selected to be transmitted with leading MSB or LSB. Multiplexer 358 permits output as follows: the I output can transmit the in-phase data stream, the in-phase data stream interleaved with the quadrature data stream, a real data stream, or test data; the Q output can transmit the quadrature data stream or test data. Spectral reversal of the output can be selected causing either a sign change in the mixing down phase from phase generator 308 or by reversal of the sign of the sine multiplier.

In another mode of operation of converter 300, phase generator 308 chirps the phase sent to sin/cos generator 306. This amounts to a sweeping of the band center frequency $f_C$ across a range of frequencies. Indeed, when phase generator 308 sends an effective phase of $2\pi n(f_C + n\Delta f/f_S)/f_S$ instead of $2\pi n f_C/f_S$ to sin/cos generator 306, then the band center frequency would be drifting in time and be instantaneously equal to $f_C + t\Delta f$ at time t. Phase generator 308 provides both positive and negative $\Delta f$ and can chirp in three ways: (1) increasing the frequency from a minimum up to a maximum and then jumping back down to the minimum and repeating, (2) decreasing the frequency from a maximum down to a minimum and then jumping up to the maximum and repeating, and (3) increasing the frequency from a minimum up to a maximum and then decreasing the frequency from the maximum back down to the minimum and repeating.

The type of data transmitted, the data's length and arithmetic representaion, the bit order, the data's spectral sense (normal or reversed) and the spectral offset, and the output drivers' impedance are all selectable via a control word.

Control Overview

Figure 6:
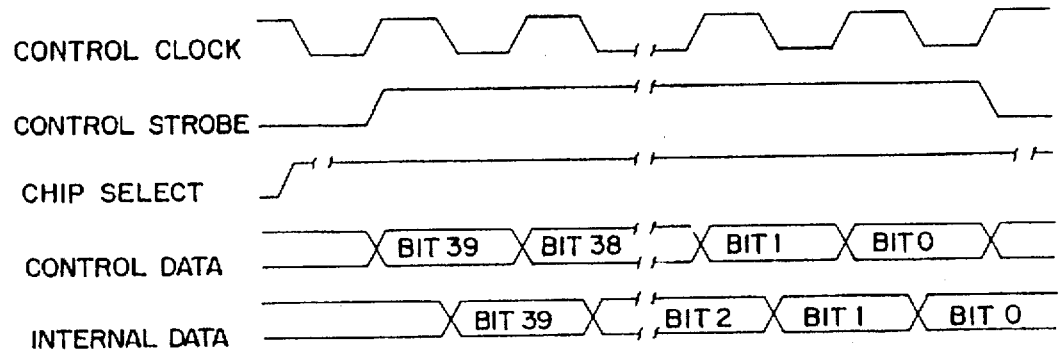
FIGS. 6–7b are timing diagrams.

Converter 300 accepts one or more 40-bit serial control words at input terminal Control Data when Control Strobe is high. Control Clock clocks in the control words with bit 39, the most significant bit (MSB), first. Bits 39–37 identify the control word type. Bit 36=1 causes the control word to be loaded into a control buffer register and all control reigsters will be updated from their respective control buffer registers. The Converter 300 update will take effect upon the next internal chip interrogation of the respective individual command/control registers. If bit 36=0, then only the control buffer register is updated. The detailed formats for Control Word 0 through Control Word 7 are described in the Control section below. FIG. 6 shows the timing for loading control words.

The use of a serial control input comports with multichip modules which package two or more silicon dice together and provide within-package bond wiring interconnecting the dice plus making connection to the package pins.

Output Summary

Figure 7A:
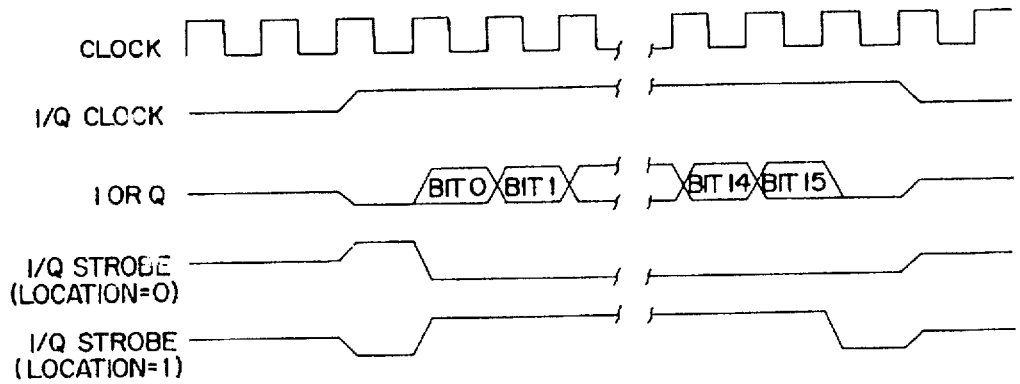
Figure 7B:
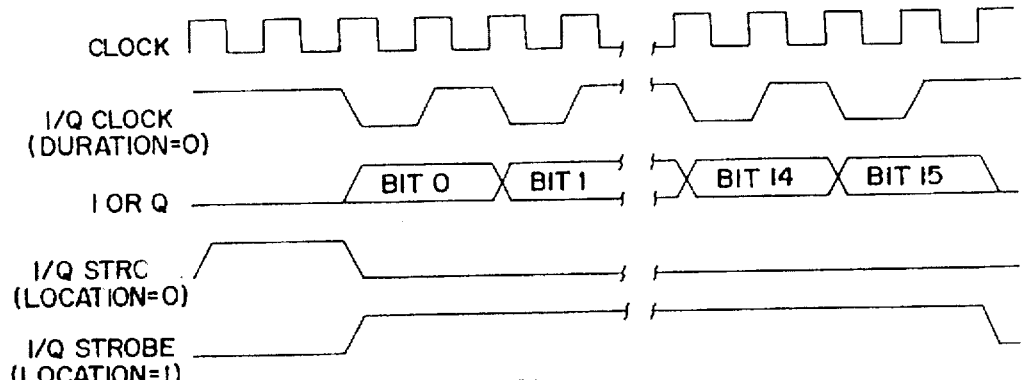

Converter 300 has output terminals I, Q, I/Q Clock, and I/Q Strobe. The I output can transmit I (in-phase) data, I data followed by Q (quadrature) data, real data or test data. The Q output can transmit Q data or test data. Control Words direct formatters 340–341 to determine the type of data transmitted, the data's length and arithmetic representation, the bit order, and the output driver's impedance. The complex data output can occur in one of two ways: simultaneous or sequential. The complex simultaneous output method serially clocks I data out on the I output terminal and simultaneously serially clocks Q data out on the Q output terminal. The complex sequential output method clocks I data and Q data out sequentially. First, the entire I word is serially clocked out on the I output terminal; then the entire Q word is serially clocked out on the I output terminal. A real data output is serially clocked out on the I output terminal. The I and Q outputs return to the zero state after the last bit is transmitted. The data output can be in one of three fixed point arithmetic representations: two's complement, unsigned or signed magnitude. Data is converted to an unsigned or offset binary format by complementaing the most significant bit of a two's complement number. The length of the output data can be symmetrically rounded with saturation logic to 16, 24 or 32 bits or the complete 38 bits of accumulators 334–335 can be accessed without rounding. The data can also be output in the IEEE single precision floating point format. The serial data stream can be MSB first or LSB first. The I and Q output drivers can be individually enabled or programmed to a high impedance condition. FIGS. 7a–b are timing diagrams generally showing the I or Q output waveforms along with the Clock, I/Q Clock, and I/Q Strobe waveforms as described in the following paragraphs.

The I/Q Strobe output pulse can be programmed to be active prior to the start of an output word at the I or Q output terminals or simultaneously with the output word. The width of the I/Q Strobe is selectable to be either the width of the Clock or I/Q Clock period. If the I/Q Strobe is active prior to the beginning of a complex or real data word, the I/Q Strobe terminates simultaneious with the beginning of the first data bit period. If the I/Q Strobe is active at the end of a complex or real data word, the I/Q Strobe terminates simultaneously with the end of the last data bit period. The polarity of the active state of the I/Q Strobe can be programmed to be either low active or high active. The I/Q Strobe's output driver can be enabled or programmed to a high implednce condition.

The I/Q Clock's rate is programmable in the range from the input Clock rate to 1/8192 of the input Clock rate.

I/Q Clock=$2^{-I/Q\ Clock\ Rate}$ Clock

If the I/Q Clock Rate is 0, then the I/Q Clock remains at the active state and Clock is used as the I/Q Clock. The duty cycle of the I/Q Clock is selectable as either one Clock period or one-half of the serial output data bit's period. The polarity of the I/Q Clock's active state is selectable as either high or low active. The I/Q Clock's duration can be programmed to be active only during I or Q output or it can be active continuously. The I/Q Clock's driver can be enabled or programmed to be high impedance condition.

Figure 2A:
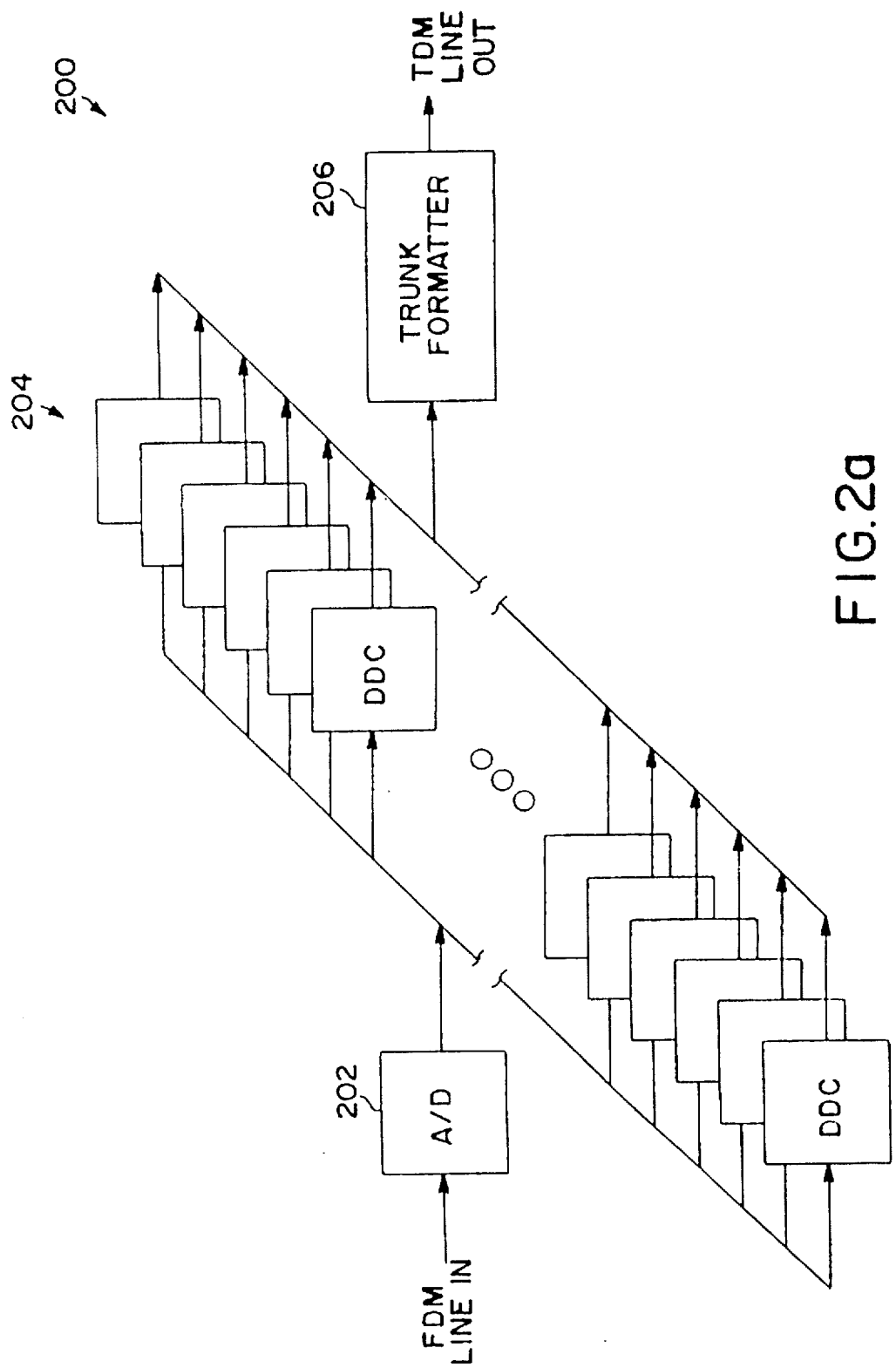
FIGS. 2a–b show a second application.
Figure 2B:
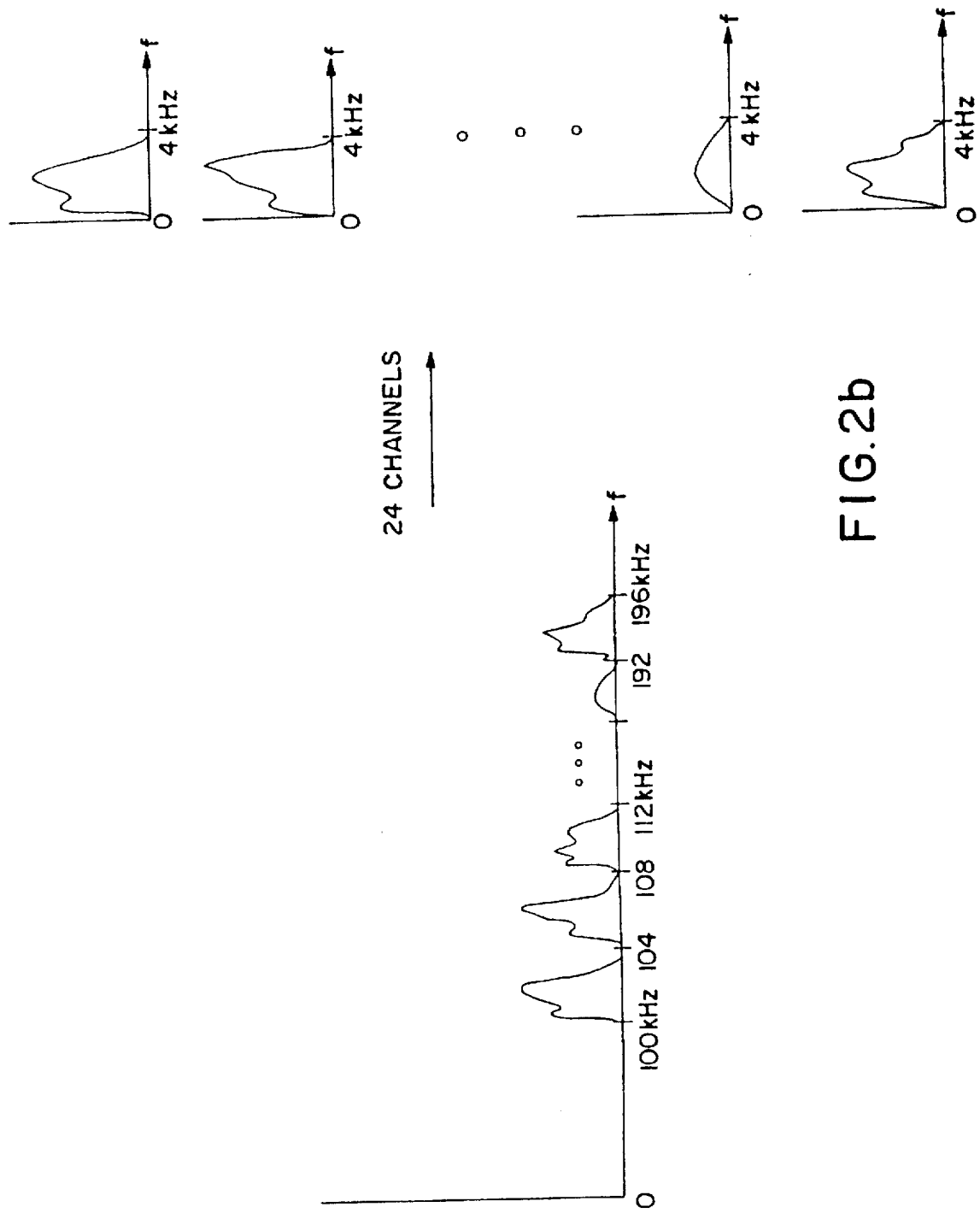

The Auto-Tri-State Enable for the I/Q Clock, I/Q Strobe, I, and Q enables the drivers one clock period prior to the beginning of the first bit of I or Q and disables the drivers one Clock period after the last bit of the I or Q data. This mode of operation allows multiple chips as in FIG. 2a to operate using common I/Q Clock, I/Q Strobe, I, and Q lines in a time shared architecture without providing a separate I/Q Enable to each chip. The I/Q Clock, I/Q Strobe, I, and Q output drivers can also be enabled with the I/Q Enable. I/Q Enable requires that the outputs be double buffered such that the output is not transmitted until enabled. An I/O Enable must occur during each output period or the output data will be overwritten and lost.

Converter 300 effectuates the various output formats as follows. Multiplexer 358 selects between I output terminal alone and I plus Q output terminals, spectral reversal corresponds to a sign choice in phase generator 308, floating point and rounding are done in formatters 340–341, upconversion by one quarter the output sampling frequency comes from a pass/complementer in formatters 340–341, and real output derives from a delay between the FIR branches.

Complex Mixing Down 16-bit data samples, x(n), in either two's complement format or unsigned format (16 magnitude bits) arrive at Data input parallel port 301 at a rate of $f_S$ and synchronized with the Clock of frequency $f_S$ entering input terminal Clock. Bit 14 of Control Word 5 determines which input format converter 300 presumes. The current data sample is loaded into 16-bit Input Register 302 on each Clock cycle and held for mulitpliers 304 and 305 to begin multiplying the x(n) currently in Input Register 302 by cos $(2\pi nf_C/f_S)$ and sin $(2\pi f_C/f_S)$, respectively, currently output by Sin/Cos Generator 306. Multipliers 304 are 305 are pipelined and a multiplication takes two Clock cycles. However, multipliers 304–305 each output one product every Clock cycle.

Figure 8:
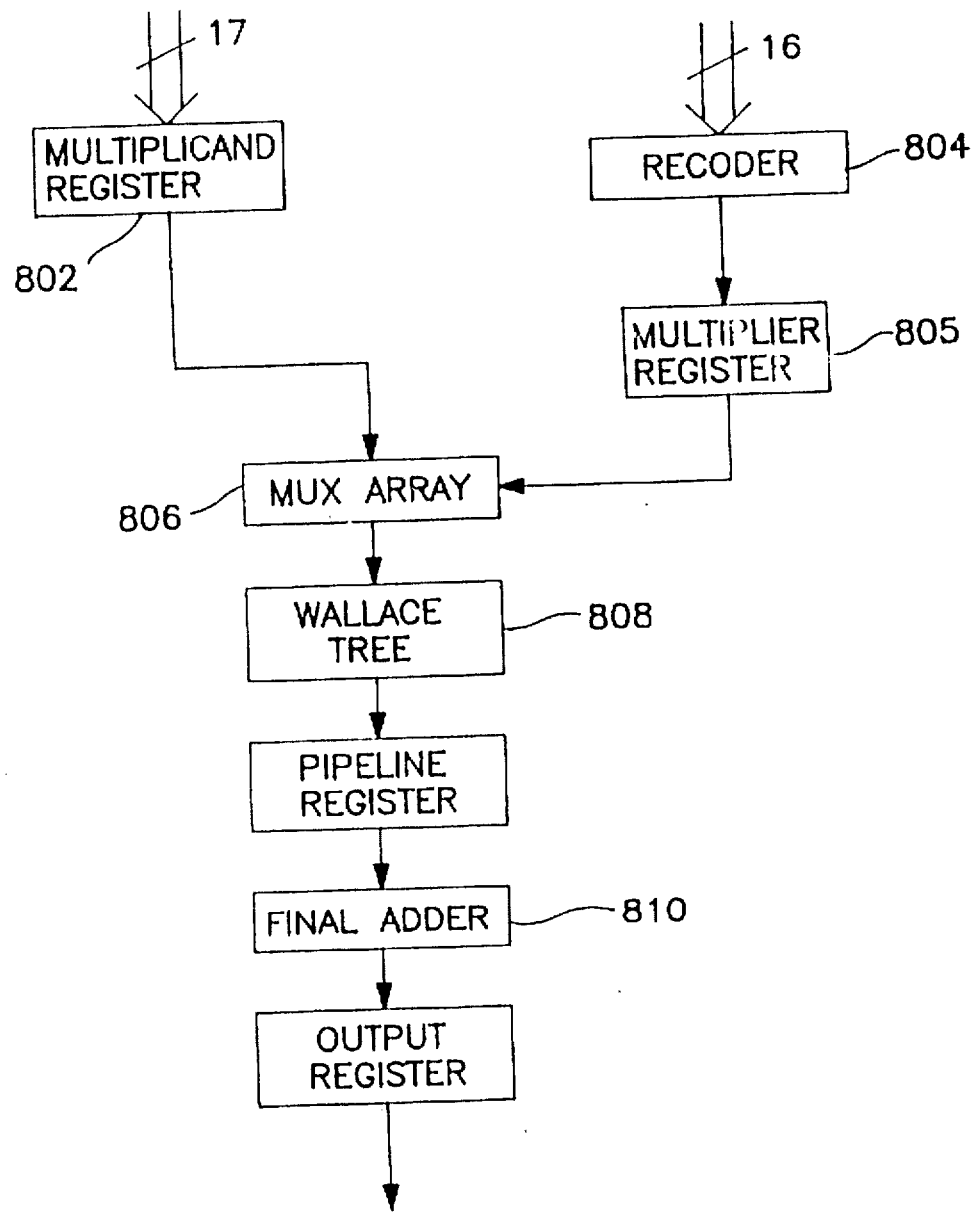
FIG. 8 illustrates a multiplier.

FIG. 8 schematically shows multipliers 304–305 in block form. These multipliers are a standard design and include multiplicand register 802 which may be the same as the corresponding sin/cos generator output register, recoder 804, multiplier register 805, multiplexer array 806, Wallace tree adder 808, and final adder 810. Because multipliers 304–305 both use the incoming data samples as the multiplier in the multiplications, recoder 804 and multiplier register 805 may be shared between multipliers 304–305. Multipliers 304–305 basically operate as follows. First consider the multipication of a 17-bit multiplicand (the sine or cosine) by a 16-bit multiplier (the data sample). Written out, this product is seen to be the sum of easily-generated partial products. For example, the multiplication of 11110000111100001 by 0101010101011101 is:

```
    11110000111100001
  x 0101010101011101
    11110000111100001
    00000  ...  00000
    111100 ... 100001
    111100 ... 100001
           ...
    111100 ... 100001
  + 00000  ...  00000
```

Clearly, each partial product may be generated by merely shifting the multiplicand for a corresponding 1 in the multiplier and is simply 0 for a corresponding 0 in the multiplier. If these numbers are in two's complement format, then sign extension bits would be added to extend the leading 1's in negative partial products out to the most significant bit position of the product. The summing of the 16 partial products consumes the bulk of the multiplication time. The summing of the partial products may be accelerated in two ways: the summing may be done in a Wallace tree plus final adder (see FIG. 9) and the multiplier may be recoded to reduce the number of partial products by use of a Booth-type algorithm. Multipliers 304–305 use both Wallace tree 808 and recode the multiplier as illustrated in FIG. 8 with multiplexer array 806 performing the shifting pursuant to the recoded multiplier.

Figure 9:
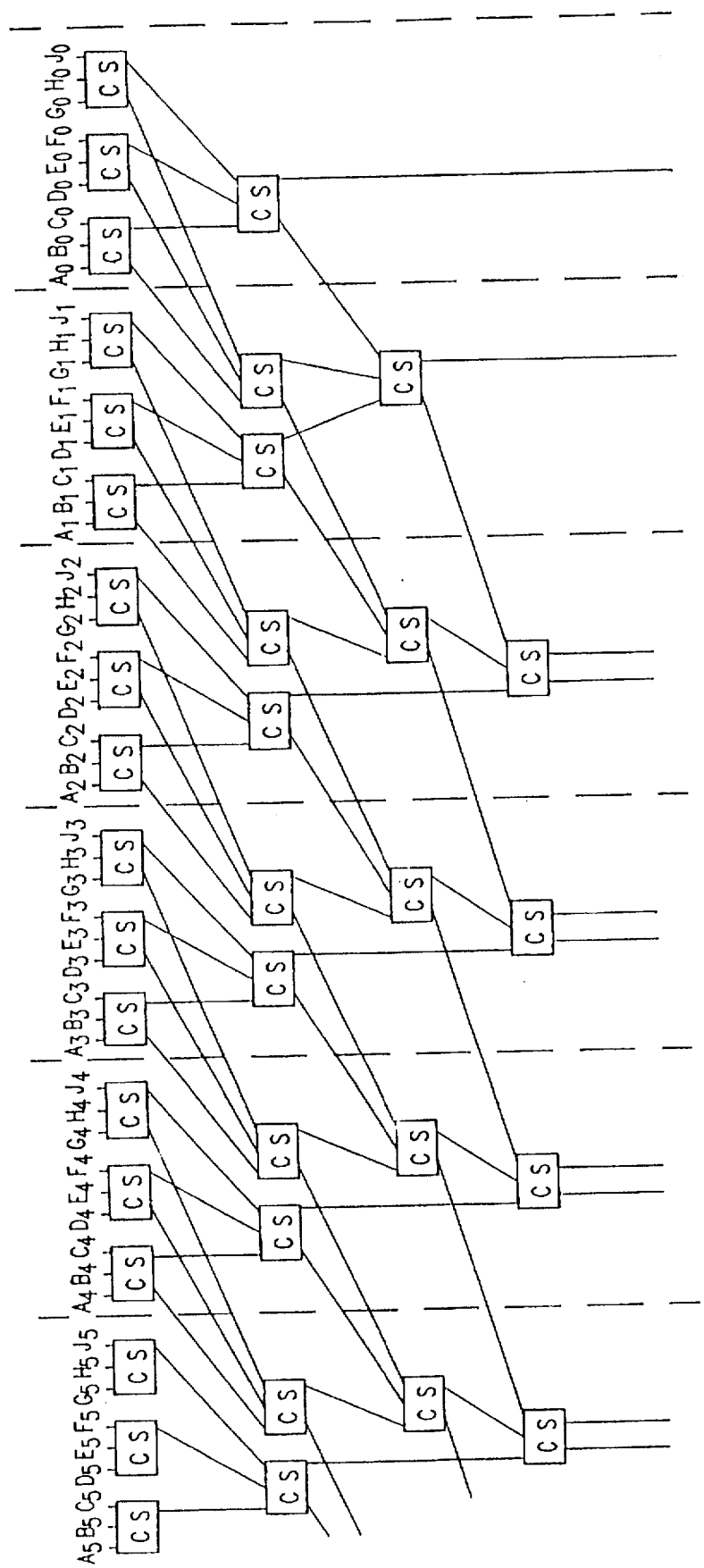
FIG. 9 illustrates a Wallace tree.

Typically, a Wallace tree consists of an array of full adders (carry save adders) which have three inputs and two outputs (the sum bit plus the carry out to higher order bit). Hence, each layer of a Wallace tree roughly reduces the number of terms by a factor of 3 to 2. FIG. 9 shows a Wallace tree for adding nine numbers called A, B, C, . . . H, and I with a subscript indicating bit order. The rectangles indicate full adders and the broken vertical lines group bits of the same order with the least significant bits on the right. Note that every carry out goes into the adjacent grouping to the left. As indicated by FIG. 9, after four levels the nine numbers have been added to form at most one sum bit and one carry bit in each bit position. The regularity of the tree is apparent in the lefthand portion of FIG. 9. These sum and carry bits are added in a final adder as shown in FIG. 8.

Recoding a multiplier to lessen the number of partial products may be done in various ways including the straightforward approach of grouping the multiplier bits in pairs to add the partial products in pairs prior to summing in a Wallace tree or other adder. In more detail, if a pair of bits of a multiplier is 00, then the sum of the partial products they generate is simply 0. Similarly, pairs 01 and 10 generate a pair of partial products with a trivially performed sum. The case of a pair 11 differs and requires a summing of the two partial products or the generation of 3 times the multiplicand. However, if the pair 11 (which represents 3) is rewritten as 100-01 (which is 4-1) and the 100 treated as a carry into the next more significant bit pair, then the sum of the two partial products has again been reduced to one partial product. This process of eliminating a sum with a carry can be made consistent as shown in the following table: the first column is a bit pair, the next column is a carry in from the adjacent less significant bit pair, the third column is the carry out to the adjacent more significant bit pair and the righthand column is the recoded bit pair which has no 11 terms and thus no sum Note that the -01 bit pair means that the multiplicand is two's complemented for negation and that the -10 bit pair means that the multiplicand is multiplied by 2 (shift left 1 bit) and then two's complemented:

| Original Bit Pair | Carry in | Carry out | Recoded Bit Pair |
|---|---|---|---|
| 00 | 0 | 0 | 00 |
| 01 | 0 | 0 | 01 |
| 10 | 0 | 0 | 10 |
| 11 | 0 | 1 | −01 |
| 00 | 1 | 0 | 01 |
| 01 | 1 | 0 | 10 |
| 10 | 1 | 1 | −01 |
| 11 | 1 | 1 | 00 |

Thus the summing in pairs of the partial products may be accomplished with the foregoing recoding which requires extra hardware for the two's complementing negations. More sophisticated recodings could be used to further shrink the number of partial products to be summed at the expense of additional hardware. Of course, each partial product must have sign extension bits if it is negative, or some equivalent.

The multiplication in multipliers 304–305 mixes down the input data sample stream by frequency $f_C$ because cos $(2\pi n f_C/f_S)$ and −sin $(2\pi n f_C/f_S)$ are the real and imaginary parts of samples at sampling frequency $f_S$ of the complex exponential $\exp(-j2\pi f_C t)$. FIG. 5c shows the resulting spectrum magnitude after multiplication. The asymmetry of the spectrum in FIG. 5c reflects the complex-valued nature of $x(n)\exp(-j2\pi n f_C/f_S)$.

Recall that a function defined on the integers, such as the data samples x(n), has a Fourier transform defined on a torus because the integers and the torus are dual groups. Also, recall that a function defined on a torus typically is indentified with a periodic function of a continuous real variable. In particular, the analog signal $X_A(t)$ is a function of the real variable t and has a Fourier transform defined as $$X_A(\Omega) = \int x_A(t) e^{-j\Omega t} dt$$

where $\Omega$ is a real variable. See FIG. 5a. The sampled signal x(n) is defined by $x(n) = x_A(nT)$ with T the sampling interval. Then x(n) has a Fourier transform defined as $$X(e^{j\omega}) = \Sigma x(n) e^{-j n \omega}$$

where $\omega$ is a real variable periodic in a $2\pi$ interval (torus). (The exponential form of the frequency variable is used to identify with the unit circle in the z transform.) The two frequency variables are related by $\omega = \Omega T$. The two Fourier transforms are related by $$X(e^{j\omega}) = 1/T \Sigma X_A([\omega + k2\pi]/T)$$

where the summation is over integral k from $-\infty$ to $+\infty$. This relation of the two Fourier transforms implies the Nyquist sampling theorem: if $X_A(\Omega)$ is zero for $|\Omega|$ greater than $f_S/2$, then at most only one term in the summation is nonzero for each $\omega$ and $X_A$ can be recovered from X.

Each Clock cycle drives Phase Generator 308 to increment its phase output (which is to be $nf_C/f_S$) by the increment $f_C/f_S$ and thus provide the next argument for Sin/Cos Generator 306. Phase Generator 308 outputs an 18-bit phase word to Sin/Cos Generator 306; but in order to provide a 0.009 Hz selectivity for $f_C$, Phase Generator 308 uses a 32-bit internal phase increment $f_C/f_S$ (For $f_S$ equal to 75 MHz, $f_S/2$ divided by $2^{32}$ is 0.009 Hz.) Multiplying the phase increment by $2^{33}$ provides Phase Generator 308 with integral output and Sin/Cos Generator 306 compensates for the $2^{33}$ factor.

Figure 10:
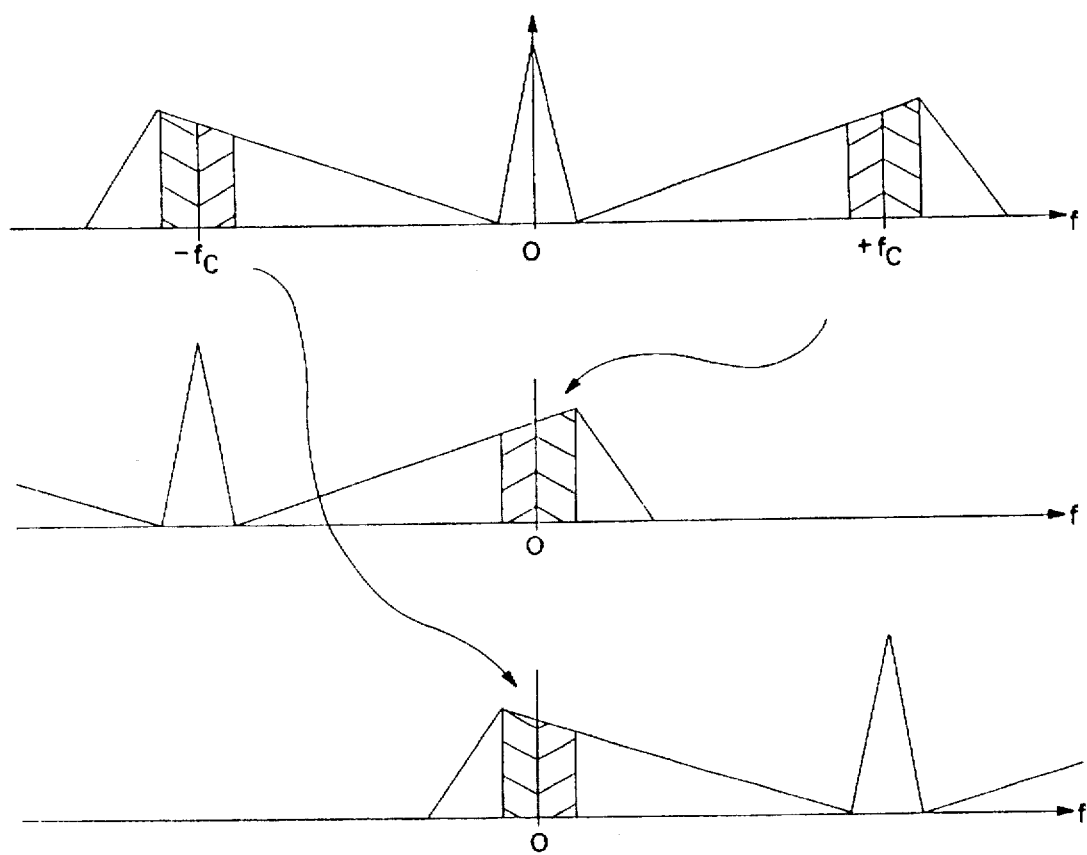
FIG. 10 shows spectral reversal.

FIGS. 5a–b show the band of frequencies about $f_C$ as positive frequencies. A corresponding band of negative frequencies about $-f_C$ contains the same information because $x_A(t)$ and $x(n)$ are real. Thus mixing down by $-f_C$ will extract essentially the same band as mixing down by $f_C$. The difference between these two bands lies in the orientation of the frequencies after mixing down. As illustrated in FIG. 10, the frequencies in the bands and with magnitudes greater than $\pm f_C$ become negative frequencies with the $+f_C$ mixing down and positive frequencies with the $-f_C$ mixing down.

The choice of sign of the phase increments from phase generator 308 determines the choice between $+f_C$ and $-f_C$ mixing down. Thus control of the sign of the phase increments provides for a selection between normal and spectral reversed output.

Another method of reversing the spectrum of the output consists of replacing −sin $(2\pi n f_C/f_S)$ by sin $(2-\pi n f_C/f_S)$ which merely amounts to noting that the sine is an odd function and the cosine is an even function of the phase angle.

Phase Generator

Figure 11:
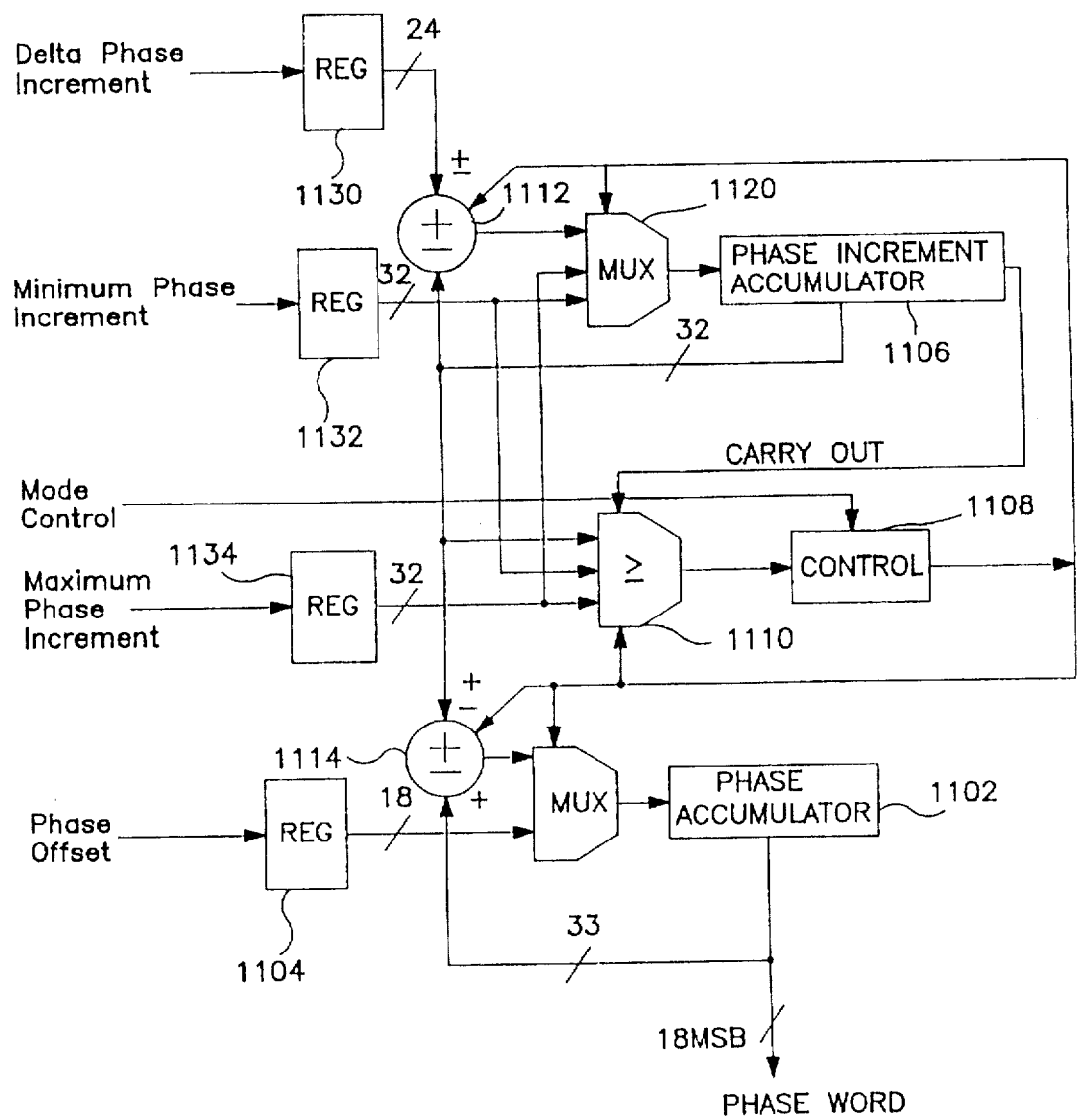
FIGS. 11–12 are schematic diagrams of phase generators.

FIG. 11 schematically shows in block format phase generator 308 which includes phase accumulator 1102 with its 18 most significant bits fed to sin/cos generator 306, phase increment accumulator 1106 with output the phase increment on each Clock cycle, control 1108, comparator 1110 for chirp excursion endpoint detection, adder/subtractor 1112 for chirp increment/decrement, adder/subtractor 1114 for incrementing/decrementing the phase accumulator 1102 value with the phase increment value from phase increment accumulator 1106, register 1130 for holding the delta phase increment for chirp use, register 1132 for holding the minimum phase increment, register 1134 for holding the maximum phase increment on chirp excursions, and register 1104 for holding the phase offset to initialize phase accumulator 1102.

The control setup loads registers 1104, 1130, 1132, and 1134 with the selected items: the phase offset is part of control word 4, the delta phase increment is part of control word 3, the minimum phase increment is part of control word 1, the maximum phase increment is part of control word 6. Thus the extracted band center frequency $f_C$ is determined as the product of the input sampling frequency $f_S$ and the 32-bit minimum phase increment from control word 1 divided by $2_{33}$: $f_C = f_S \times$(minimum phase increment) $/2^{33}$. (The extracted band width derives from the decimation rate found in control word 2.) The 32-bit accuracy of the minimum phase increment allows selection of $f_C$ within 0.009 Hz for a data sampling rate of $f_S = 75$ MHz.

Phase generator 308 operates as follows. First a 32-bit minimum phase increment, a 24-bit delta phase increment, an 18-bit phase offset, and a 32-bit maximum phase increment as part of the control words are loaded into the registers plus the mode command word (part of control word 1) is loaded into control 1108.

The minimum phase increment is:

$$\text{Minimum Phase Increment} = 2^{33} f_C/f_S,$$

where $f_C$ is the desired mixing down center frequency and $f_S$ is the input sampling frequency.

During normal mixing down operation, the minimum phase increment is loaded into the phase increment accumulator 1106, the delta phase increment in register 1130 and the maximum phase increment in register 1134 are ignored. The phase accumulator 1102 is continuously incremented by the output of the phase increment accumulator 1106.

During up chirp operations, the minimum phase increment is loaded through multiplexer 1120 into the phase increment accumulator 1106. The delta phase increment from register 1130 is added by adder 1112 to the least significant bits of the phase increment accumulator 1106 to form a new phase increment accumulator value at each clock. The phase increment is allowed to grow until the maximum phase increment value in register 1134 is reached or exceeded as detected by comparator 1110. When the maximum phase increment is reached or exceeded phase increment accumulator 1106 is reset to the minimum phase increment value, phase accumulator 1102 is reset to the phase offset value in register 1104, and the cycle is repeated.

During down chirp operations, the maximum phase increment in register 1134 is loaded into the phase increment accumulator 1106. The delta phase increment from register 1130 is subtracted from the least significant bits of the phase increment to form a new phase increment accumulator value at each clock. The phase increment is allowed to diminish until the phase increment is less than the minimum phase increment value. The phase increment accumulator 1106 is then reset to the maximum phase increment value, phase accumulator 1102 is reset to the phase offset value, and the cycle is repeated.

At the beginning of a up/down chirp operation, phase accumulator 1102 is set to the phase offset value from register 1104 and the minimum phase increment is loaded into the phase increment accumulator 1106. The delta phase increment is added to the least significant bits of the phase increment accumulator to form a new phase increment accumulator value at each clock. The phase increment is allowed to grow until the phase increment is greater than or equal to the maximum phase increment value. The delta phase increment value is then subtracted from the least significant bits of the phase increment accumulator to form a new phase increment accumulator value at each clock The phase increment is allowed to diminish until the phase increment is less than the minimum phase increment value. The delta phase increment is again added to the least significant bits of the phase increment accumulator to form a new phase increment accumulator value at each clock, thus beginning the repeat of a up/down cycle.

The minimum phase increment and the maximum phase increment have allowable values from 0 to $2^{32}-1$. This corresponds to the phase increment:

$$0 \leq \text{Phase Increment} \leq \pi - \pi/2^{32}$$

The phase increment accumulator's output is normally subtracted from the phase accumulator to form the new phase accumulator value. The output of the phase increment accumulator may be added to the phase accumulator to form the new phase accumulator value or the sign of the sine value used in the imaginary down mixing chain can be negated when a spectral reversed output is specified. The most significant 18 bits of the phase accumulator are the 18-bit phase word, as shown in FIG. 11. When the 18-bit phase offset is loaded into the 18 most significant 18 bits of the phase accumulator, the lower bits of the phase accumulator are zeroed. The sin/cos generator 306 is controlled by the 18-bit phase word.

The output of the sin/cos generator 306 is scaled to prevent overflow in the real multipliers during rounding. The result of each of the real multiply operations is symmetrically rounded to 17 bits to preserve the 102 dB of spurious free dynamic range.

Figure 12:
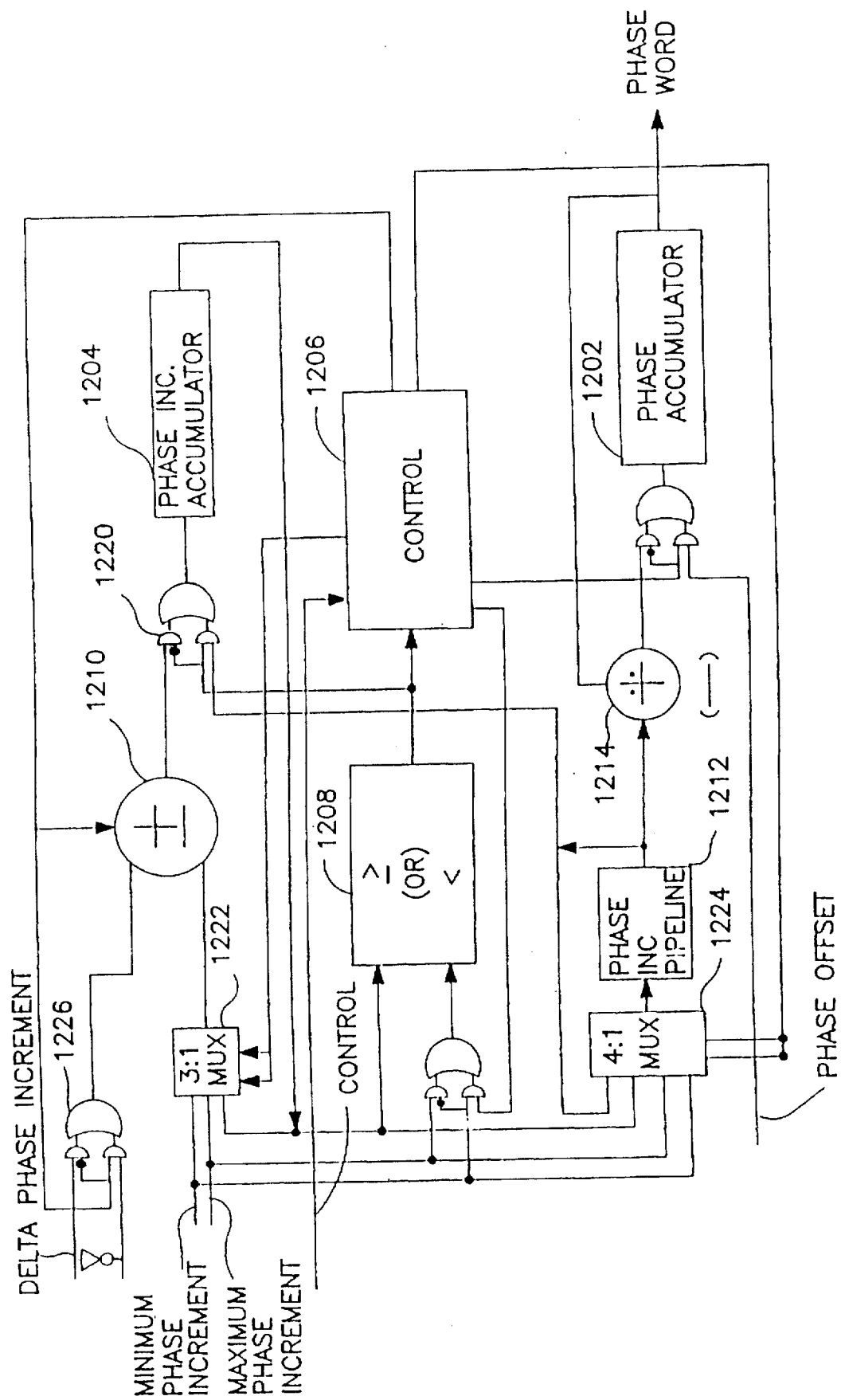

FIG. 12 schematically shows in block format a second preferred embodiment phase generator which could be used for phase generator 308 which includes phase accumulator 1202 with output going to sin/cos generator 306, phase increment accumulator 1204 with output the phase increment on each Clock cycle, control 1206, comparator 1208 for chirp up-down endpoint detection, adder/subtractor 1210 for chirp direction, phase increment pipeline 1212 plus adder 1214 for incrementing the phase accumulator, multiplexers, and registers (not shown) for holding the minimum phase increment, the delta phase increment, the maximum phase increment, and the phase offset.

The control setup loads the registers as in the first preferred embodiment of FIG. 11.

The second preferred embodiment phase generator 308 operates as follows for a (nonchirped) complex modulation. The minimum phase increment and the phase offset have previously been loaded into 32-bit and 18-bit registers, respectively, as part of the control setup. The 32-bit phase increment accumulator 1204 and 33-bit phase accumulator 1202 have been reset to 0 (two's complement). Next, control 1206 drives multiplexers 1220 and 1222 and adder 1210 to load the minimum phase increment into phase increment accumulator 1204 and load the phase offset into the 18 most significant bits of phase accumulator 1202. The phase offset is the starting phase angle for sin/cos generator 306. Then during the complex modulation, on each Clock cycle control 1206 drives multiplexer 1224 to pass the minimum phase increment held in phase increment accumulator through phase increment pipeline 1212 to adder 1214 which adds the minimum phase increment to the current phase and puts this in the phase accumulator 1202. Thus on the nth Clock cycle phase accumulator 1202 holds PO+nBPI where PO stands for the phase offset and BPI stands for minimum phase increment. As an example, take PO to correspond to $\pi/8$ and BPI to be the increment for $f_c=10$ MHz and $f_s=50$ MHz. The BPI equals $2^{33}/5$ and PO=$2^{29}$. The 18 most significant bits from phase accumulator 1202 drive the address inputs of sin/cos generator. See the addressing scheme in the sin/cos generator section.

Phase generator 308 operates as follows for chirped phase. The delta phase increment determines the chirp rate $\Delta f$ as follows. Delta phase increment is set equal to the desired phase increment step. As with nonchirped operation, control 1206 loads the phase offset into phase accumulator 1202 and the minimum phase increment into phase increment accumulator 1204 for an up chirp (or the maximum phase increment for a down chirp). During operation control 1206 on each Clock cycle drives multiplexer 1224 and phase increment pipeline 1212 plus adder 1214 to add the contents of phase increment accumulator 1204 to the phase in phase accumulator 1202 and put the sum into phase accumulator 1202 as the new phase. Control 1206 also drives multiplexer 1226 and adder 1210 to add the delta phase increment to the phase increment in phase increment accumulator 1204 and put the sum into phase increment accumulator 1204 as the new phase increment for an up chirp. For a down chirp the negative delta phase increment is used. Comparator 1208 compares the current phase increment in phase increment accumulator 1204 to the maximum phase increment during an up chirp (and to the minimum phase increment during a down chirp) to detect the end of a chirp phase sweep. Upon detection of an endpoint, control 1206 resets phase increment accumulator 1204 and reloads it with the minimum phase increment for an up chirp (or the maximum phase increment for a down chirp) and continues the incrementing by the delta phase increment. For up-down chirping, control 1206 just reverses the sign of the delta phase increment being used when comparator 1208 detects an endpoint.

13

Bits 0–2 of control word 1 select among the modes.

Sin/Cos Generator

A sin/cos generator in general takes a phase (angle) input and outputs the sine and cosine of the input angle. Thus a sin/cos generator could be realized in various ways, such as directly computing the sine and cosine by a Taylor's series of the input angle or as retrieving stored sine and cosine values from a memory with the input angle determining the memory address for retrieval. Typically, the memory retrieval approach would use a read-only memory (ROM). Further, there is a tradeoff between ROM size and additional arithmetic hardware. This tradeoff arises from expressing the input angle as a sum of a coarse angle plus a fine angle (roughly analogous to expressing a number between 0 and 99 as a multiple of 10 plus a multiple of 1) and using the sum of angles identities for the sine and cosine:

$$\sin (A+B) = \sin (A) \cos (B) + \cos (A) \sin (B)$$

$$\cos (A+B) = \cos (A) \cos (B) - \sin (A) \sin (B)$$

That is, compute the sine and cosine of the input angle in terms of the sines and cosines of the coarse angle and sines and cosines of the fine angle. Hence, only the sines and cosines of the coarse angles and the fine angles need be stored. Of course, the multiplications and additions require hardware.

As an example of the ROM size/hardware tradeoff consider 16-bit angle resolution for the range 0 to $\pi/2$. (All other sines and cosines can be computed using symmetry and periodicity.) If every sine and cosine were stored, then $2 \times 2^{16}$(128K) words would be stored. And if 17-bit accuracy in the stored values were required, then each word is 17 bits and the total ROM capacity needed would be $2 \times 2^{16} \times 17 = 2228224$ bits. This is more than 2 megabits and would occupy a large area of a chip.

But with the expression of an input 16-bit angle as a sum of an 8-bit coarse angle plus an 8-bit fine angle, then only $2 \times 2^8$ coarse angle sines and cosines need be stored along with the $2 \times 2^8$ fine angle sines and cosines. The 256 coarse angles would run from 0 to $255\pi/512$ with increments of $\pi/512$ and the 256 fine angles would run from 0 to $255\pi/131072$ with increments $\pi/131072$. In this case the total ROM capacity need only be $2 \times 2 \times 2^8 \times 17 = 17408$ bits. Thus the storage capacity can be reduced by a factor of 128 at the cost of multipliers and adders to implement the sum of angles computations.

Figure 13:
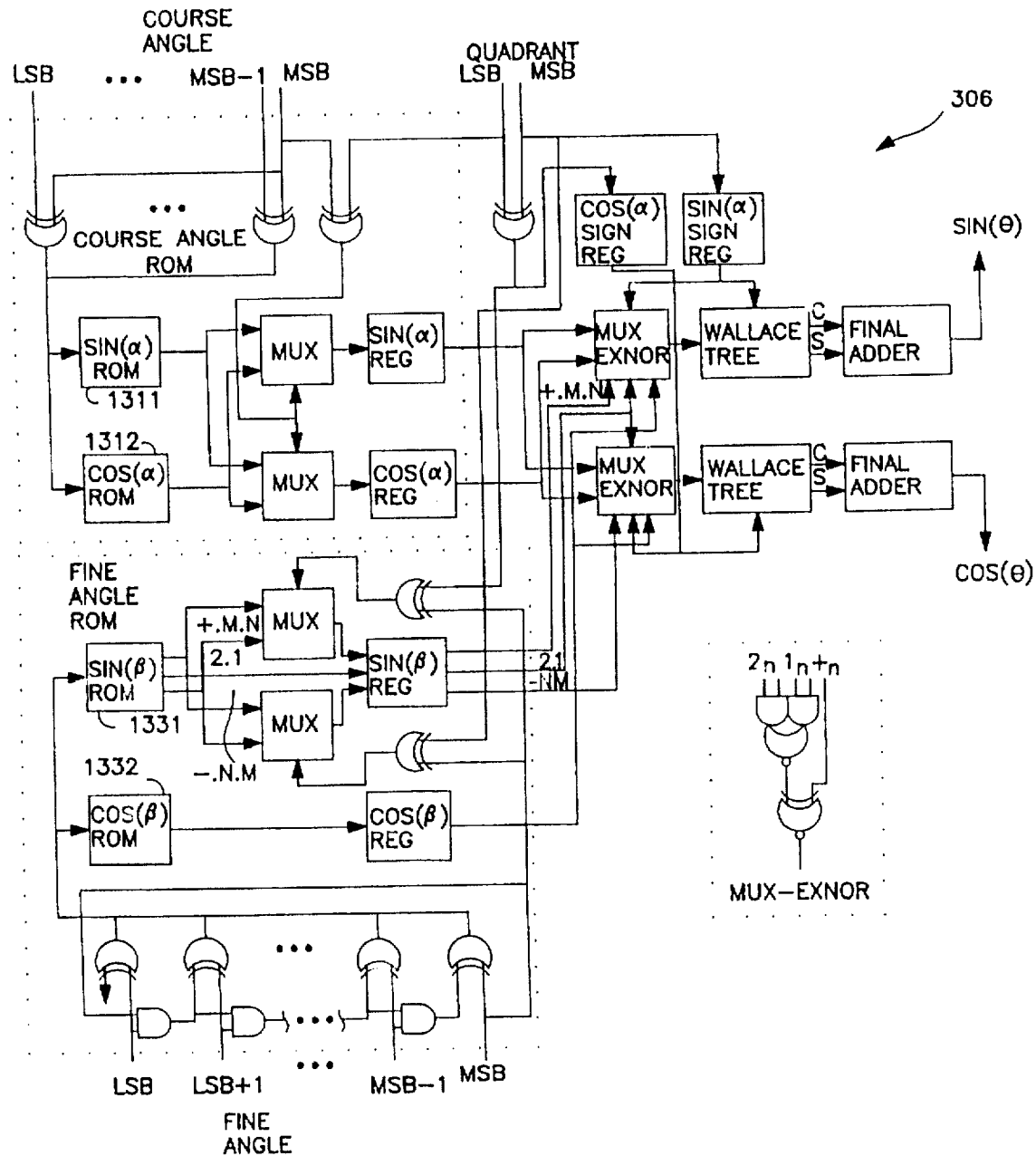
FIG. 13 shows a sin/cos generator in block form.
Figure 14:
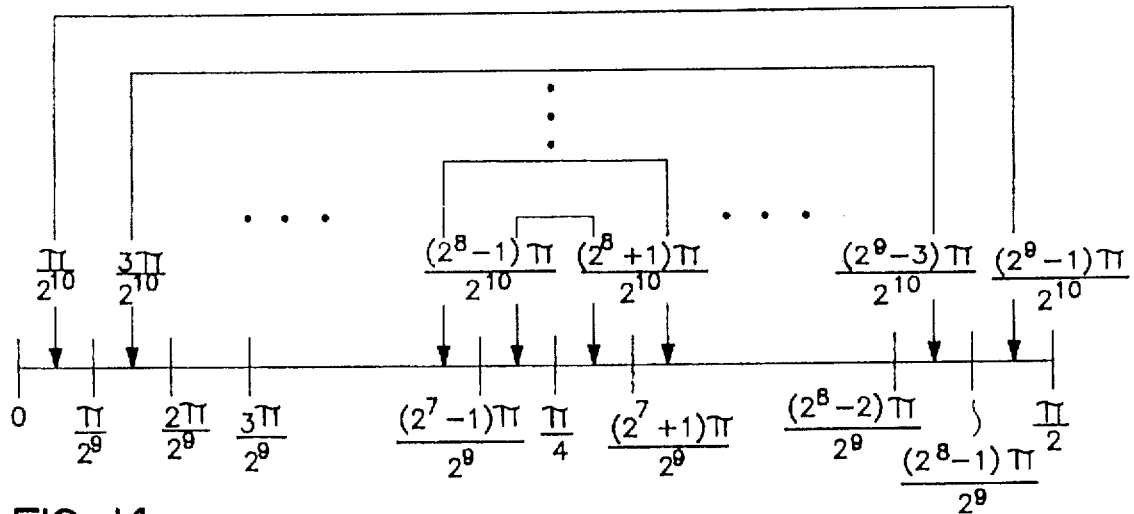
FIGS. 14–15 illustrate angle partitioning and sin/cos storage.

FIG. 13 schematically shows in block form sin/cos generator 306 which includes coarse angle sine and cosine ROMs 1311–1312 plus fine angle sine and cosine ROMs 1331–1332. On each Clock cycle phase generator 308 feeds an 18-bit angle to sin/cos generator 306. The 18 bits have the following format: the 2 most significant bits encode in which of the four quadrants $(0-\pi/2, \pi/2-\pi, \pi-3\pi/2,$ and $3\pi/2-2\pi)$ the angle lies. The next 8 bits effectively define the coarse angle, and the last 8 bits define the fine angle. In particular, sin/cos generator 306 stores the coarse angle sines and cosines only up to $\pi/4$. For the other half of the quadrant $(\pi/4 < x < \pi/2)$, the trigonometric relations $\sin (x) = \cos (\pi/2 - x)$ and $\cos (x) = \sin (\pi/2 - x)$ permit use of the stored values to find the sines and cosines; see FIG. 14 illustrating the symmetry.

Note that the storage is symmetric about $\pi/4$ and excludes the endpoints. Indeed, the 256 coarse angles are centered in the 256 intervals of size $\pi/512$ consituting the interval 0 to $\pi/2$. The symmetry permits one's complementing of an address to switch between sine and cosine. Further, the

Figure 15:
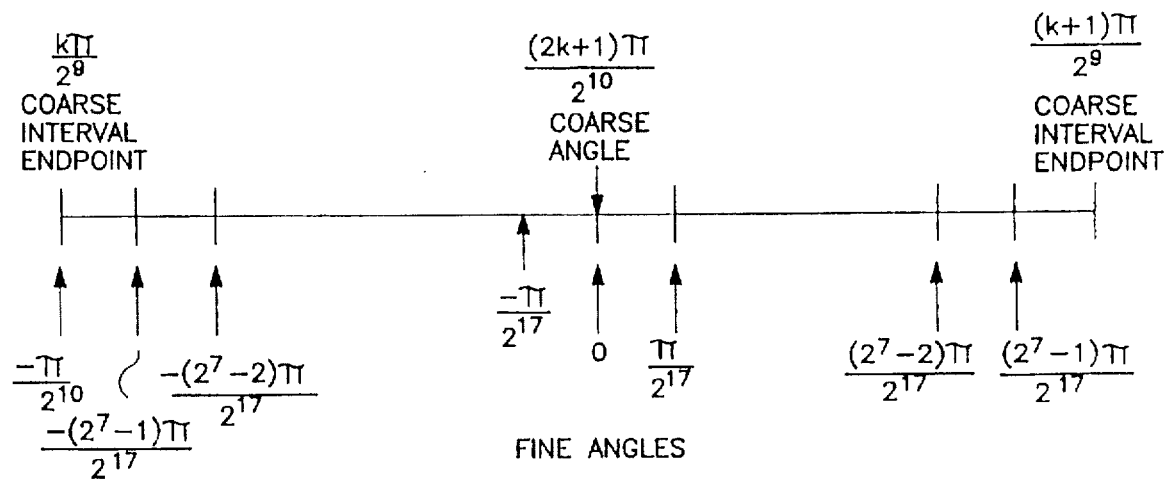

14 coarse angles centering in the 128 intervals demands negative fine angles in order to cover the entire 0 to $\pi/4$ interval. The fine angles are essentially symmetric about 0 as in FIG. 15.

The fine angles have a two's complement addressing scheme. The use of both positive and negative fine angles implies that the largest fine angle magnitude has been halved compared to the use of fine angles of only one sign. This improves the approximations for the fine angle sine and cosine by factors of about 8 and 4, respectively, and fewer values need be stored in the fine angle ROMs.

Details of sin/cos generator 306 appear in cross-referenced U.S. Pat. No. 5,276,633, although other implementations of a sin/cos generator could also be used.

High Decimation Filter

5-Stage Decimation Filters 312 and 313 lowpass filter and decimate by a factor of R the sampling rate of the 17-bit outputs $x(n) \cos (2\pi n f_C/f_S)$ and $x(n) \sin (2\pi n f_C/f_S)$ of multipliers 304 and 305, respectively. That is, the output of Decimation filters 312 and 313 has a sampling frequency of $f_S/R$. Decimation filters 312 and 313 have broad transitions from passband to stopband but have programmable decimation rates R. Thus for a selected extraction bandwidth, $f_{B_W}$, R is taken to be about $0.07 f_S/f_{B_W}$. The 0.07 factor arises from FIR filter section 320. However, the structure of the decimation filters requires R be an integer between 16 and $2^{15}$, inclusive, and this limits the selectable bandwidths. For example, a sampling frequency $f_S$ of 50 MHz limits the selected bandwidth to lie in the range from about 210 Hz to about 1.1 MHz.

Figure 16:
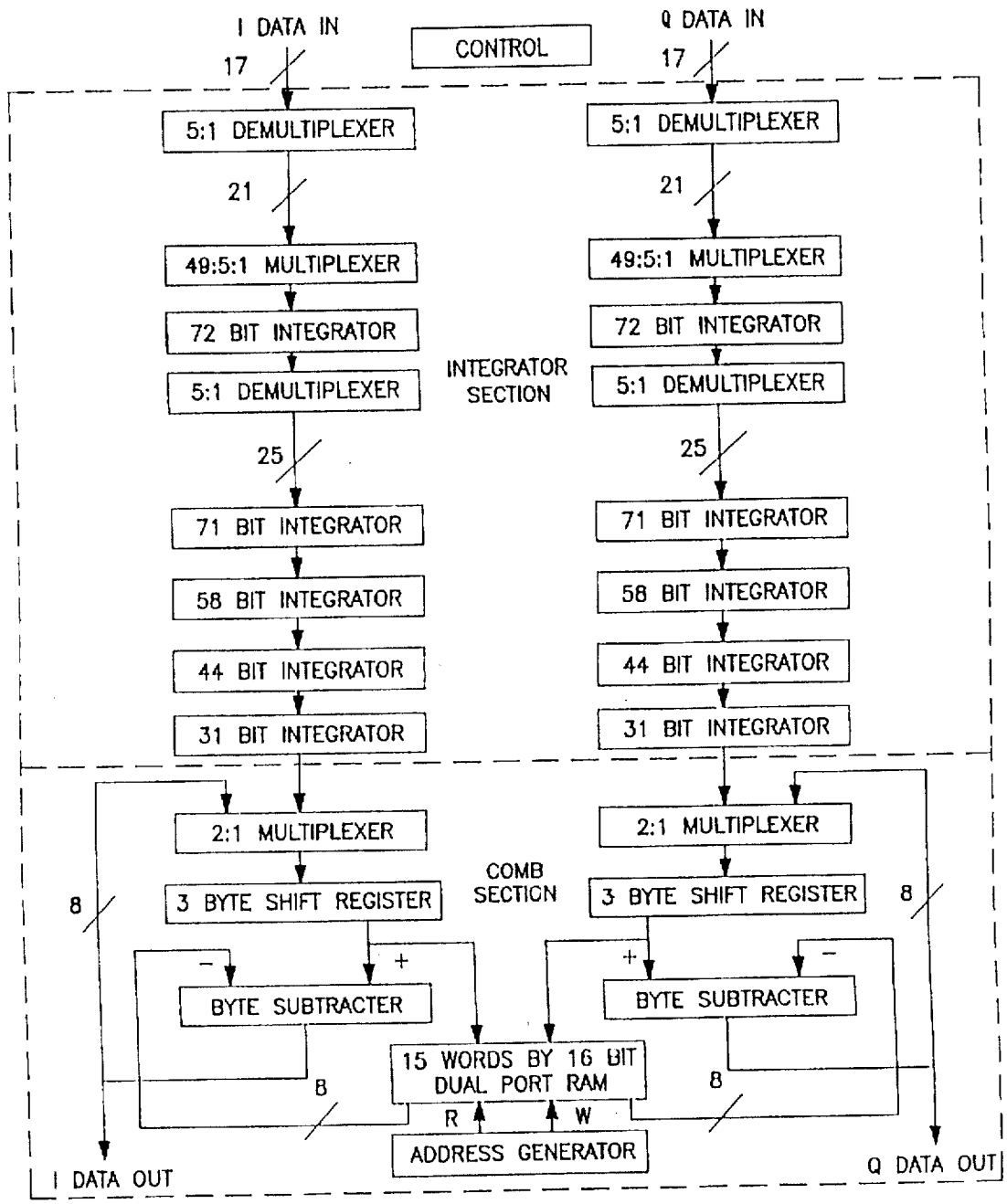
FIG. 16 is a schematic diagram of a decimation filter.

FIR filter section 320 provides a sharp transition lowpass filtering and compensates for the broad transitions of the Decimation Filters. See FIGS. 5g–i. Decimation Filters 312 and 313 operate basically as 5-stage comb filters (five integrator stages followed by subsampling and a 5-stage comb section). FIG. 16 shows decimation filter section 310 in block form and illustrates the replacement of the 5-stage comb with a memory and serial subtraction comb section. FIG. 5d shows the spectrum magnitude of the transfer function of the Decimation Filters in terms of the original sampling frequency. Decimation Filters 312 and 313 output 18-bit in-phase $u_I(m)$ and quadrature $u_Q(m)$ samples to scaling multipliers 318–319 once every R Clock cycles to lower the output sampling frequency to $f_S/R$.

Details of decimation filters 312 and 313 appear in cross-referenced U.S. Pat. No. 5,455,782, although other implementations of high decimation filters could also be used.

Scaling Multiplier

Scaling multipliers 318 and 319 compensate for the gain of Decimation Filter 310. The gain depends on the decimation rate as follows:

$$\text{Log}_2(\text{gain}) = 5 \text{Log}_2 R - \lceil 5 \text{Log}_2 R \rceil$$

where $\lceil x \rceil$ denotes the smallest integer not less than x (the ceiling function). Thus the logarithm of the gain is nonpositive and magnitude less than 1, so the gain lies in the range of 0.5 (exclusive) to 1.0 (inclusive). Hence, multipliers 318–319 must provide a scale factor in the range from 1 (inclusive) to 2 (exclusive); this scale factor is loaded into converter 300 as bits 5–20 of Control Word 2.

The final output of Decimation Filter 310 is to be 17 symmetrically rounded bits, and the gain may close to 0.5.

Thus to preserve the 17-bit true dynamic range in the worse case, decimation filter 310 passes 18 truncated bits (two's complement format) for $u_I(m)$ and $u_Q(m)$ to scaling multipliers 318–319. Scaling multipliers 318–319 multiply the 18-bit $u_I(m)$ and $u_Q(m)$ by the 16-bit (unsigned format) scale factor to produce symmetrically rounded 17 bit (two's complement format) outputs $v_I(m)$ and $v_Q(m)$ which feed FIR section 320. The use of scaling multipliers 318–319 avoids carrying an extra bit of precision and permits the use of FIR section 320 with fixed filter coefficients.

Figure 17:
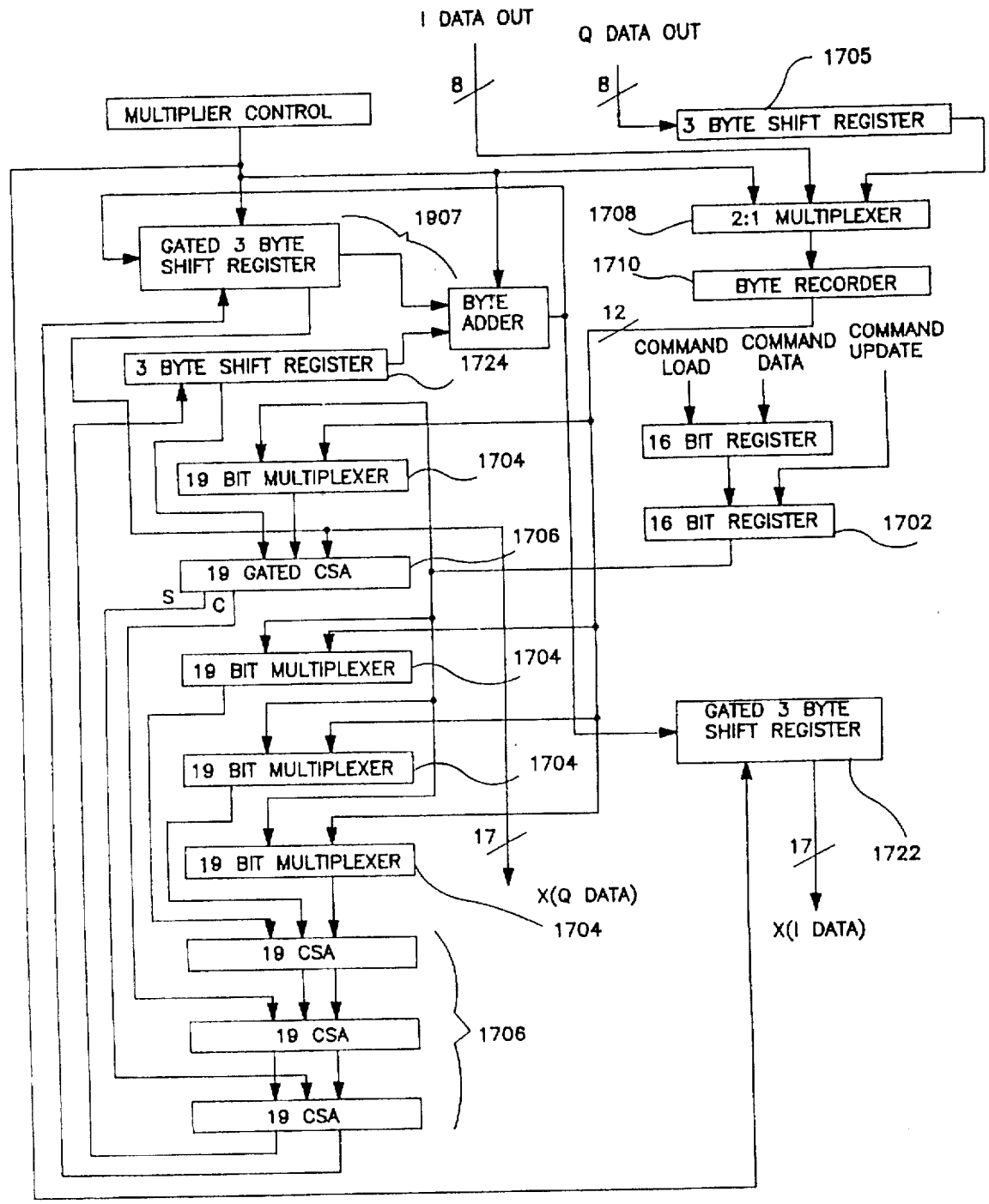
FIG. 17 schematically shows a sealing multiplier.

FIG. 17 shows an alternative embodiment in which $u_I(m)$ and $u_Q(m)$ are multiplexed and a single scaling multiplier replaces multipliers 318–319. The scaling multiplier of FIG. 17 operates as follows. The 16-bit scale factor is loaded into register 350 as part of control word 2 and shifted to 16-bit register 1702 to feed a multiplicand to the 19-bit multiplexers 1704 which shift and input to Wallace tree 19-bit entry full adders 1706 and final adder 1707. The $u_I(m)$ and $u_Q(m)$ outputs of decimation filter 310 arrive as serial bytes and the $u_Q$ bytes fill 3-byte register 1705 which connects to multiplexer 1708, whereas the $u_I$ bytes directly feed multiplexer 1708. Multiplexer 1708 passes either a $u_I$ byte or a byte $u_Q$ to byte recoder 1710 which recodes the byte to provide the shift and enter controls for multiplexers 1704. The recoding is bit pairwise and thus a byte becomes four sets of controls. Decimation filter 310 has decimated the sampling rate by at least 16, so the six bytes of $u_I$ and $u_Q$ may be serially processed. This limits the hardware required. The outputs of the adder 1707 produce final sum bytes which it feeds to gate byte shift registers 1722 and 1724 for the $v_I(m)$ and $v_Q(m)$ outputs, respectively.

Gain compensation by the scaling multipliers permits FIR filter 320 to have fixed coefficients because the FIR filter coefficients need not compensate for the Decimation Filter gain. The location of the scaling multiplier(s) between decimation filter 310 and the FIR filter provides for a steady word length in decimation filter 310 as the decimation rate varies. Indeed, if the scaling multiplier preceded the decimation filter, then an extra bit would be needed because the inputs to decimation filter would vary by a factor of 2 as the decimation rate varies about a power of 2. Further, if the scaling multiplier followed the FIR, then an extra bit would be required in the FIR to preserve the dynamic range. With the scaling mulitplier between the decimation filter and the FIR filter the extra bit(s) available in the decimation filter output can be used to preserve the dynamic range without any effect on the word size within the decimation filter or the FIR filter as the decimation rate varies. Of course, the location of the scaling multiplier architecture between the high decimation filter and the FIR filter produces this result, not the specific multiplier architecture.

FIR Filter Characteristics

FIR section 320 implements a lowpass filter which provides a spectral shape to counter the broad transition band of the high decimation filters 312–313. Such a filter can be implemented in many ways, and FIR section 320 conveniently implements a symmetrical lowpass FIR filter of order 121. This filter order relates to the minimum decimation rate and the implementation hardware. The filter's passband is precompensated to the inverse of the Decimation filter passband slope. In particular, the FIR filter passband may be derived by specifying five adjacent passbands plus a stopband. Each passband has contant gain but the gains increase compensate for the decrease in gain with frequency of the passband of the decimation filter:

| Filter order | 121 | | | |
| Grid density | 16 | | | |
| Number of bands | 6 | | FIR Design Parameters | |
| Band | Lower Edge | Upper Edge | Weight | Gain |
| --- | --- | --- | --- | --- |
| 1 | 0.00000 | 0.02500 | 0.5 | 0.97395 |
| 2 | 0.03500 | 0.04250 | 0.5 | 0.98252 |
| 3 | 0.04500 | 0.05000 | 0.5 | 0.98949 |
| 4 | 0.05250 | 0.05500 | 0.5 | 0.99447 |
| 5 | 0.05750 | 0.06000 | 0.5 | 0.99900 |
| 6 | 0.10000 | 0.50000 | 750.00 | 0.00000 |

| Order | Coefficient Quantization | Maximum Passband Deviation (dB) | $-3$ dB Point | $-102$ dB Point | Shape Factor 3:102 (dB) | Minimum Stopband Attenuation (dB) |
| --- | --- | --- | --- | --- | --- | --- |
| 121 | 22 | 0.0337 | 0.0703125 | 0.0996094 | 1.425 | 106 |

The 106 dB of stopband attenuation and 17-bit accuracy internally provides a spurious free dynamic range of 102 dB.

Figure 5I:
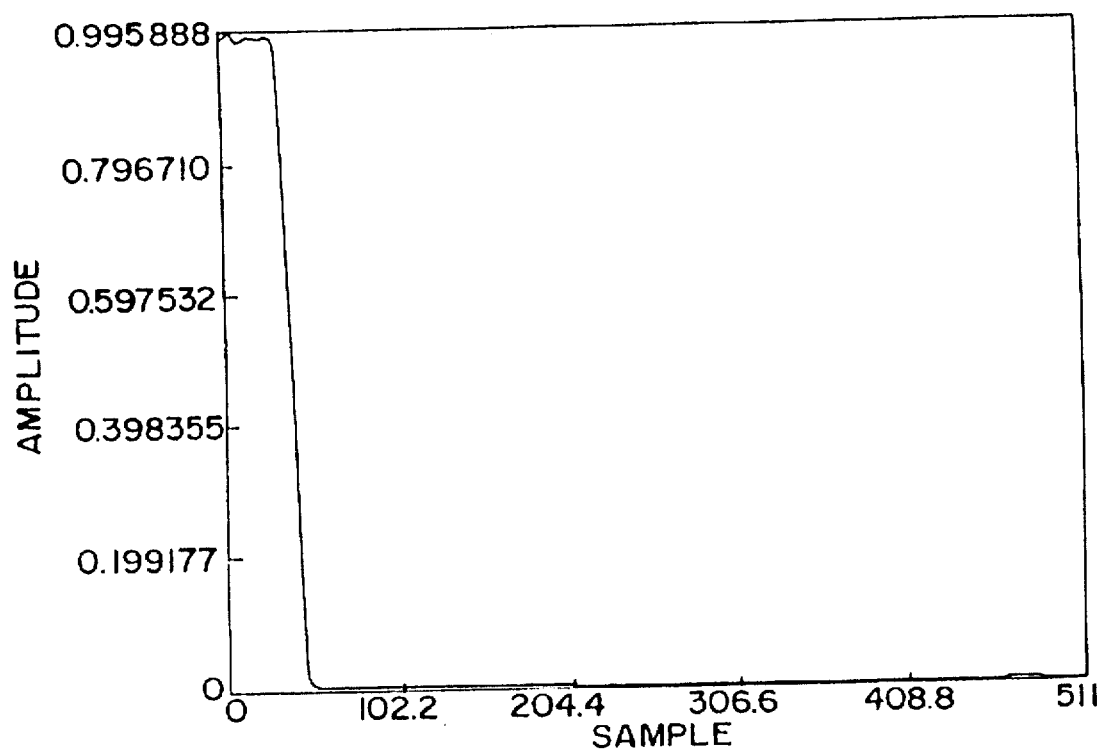

FIG. 5g shows the spectrum magnitude of the transfer function of the FIR filter, and FIG. 5h shows the composite Decimation filter plus FIR transfer function spectrum magnitude. FIG. 5i shows the same composite transfer function spectrum as FIG. 5h but with a linear rather than a logarithm vertical scale. FIG. 5j shows the spectrum of the final filtered output.

As FIG. 3 shows, FIR section 320 receives the two digital data streams, $v_I(m)$ and $v_Q(m)$, from scaling mulitpliers 318–319 and loads the 17-bit words into 244 by 17-bit dual port RAM 322. RAM 322 stores 244 words because the filter order of 121 applies to both the inphase branch filtering $v_I(m)$ and the quadrature branch filtering $v_Q(m)$ for a total of 242 words. A delay of two words in the in phase branch enhances efficiency (detailed in the FIR Real Output section below) and requires storage of two additional words.

The symmetry of the FIR filter allows the two data samples associated with a pair of symmetric coefficients to be preadded in adders 324–325 and their sum to be multiplied by the coefficient value (stored in ROM 328) in multipliers 332–333. More explicitly, let the coefficients of the FIR filter be denoted by $c_0, c_1, \ldots c_{120}$; then the symmetry of the filter coefficients means $c_0=c_{120}$, $c_1=c_{119}, \ldots c_{59}=c_{61}$. Thus the filter computation $$\Sigma c_j v_I(m+j)$$

where the sum is over j from 0 to 120 can be recast as $$\Sigma c_j[v_I(m+j)+v_I(m+120-j)]$$

where the sum is over j from 0 to 60 and $c_{60}$ is replaced by $c_{60}/2$ so the center term of the first sum is recast as $c_{60}/2[v_I(m+60)+v_I(m+60)]$ in the second sum. A similar computation applies for $V_Q$ in the quadrature branch. Preadder 325 generates the pairwise additions $v_I(m+j)+v_I(m+120-j)$. Because each $v_I(m)$ is a 17-bit word, the pairwise additions are 18-bit words. The filter coefficients $c_j$ are 22-bit words (for 106 dB stopband attenuation) each with magnitude less than ¼, so 20 physical bits suffice. Thus the products $c_j[v_I(m+j)+v_I(m+120-j)]$ from multiplier 333 are 38-bit words, and the sixty-one products are accumulated in 38-bit accumulator 335.

FIR section 320 receives the $v_I(m)$ and $v_Q(m)$ sample stream at a decimated sampling rate of $f_s/R$, so multipliers 332–333 must generate the 61 products within R Clock cylces. Now an extra factor of 4 arises from a further decimation as described in the FIR section below, so the 61 products must be generated within 4R Clock cycles. This gives rise to the minimum permitted decimation rate R as 16:4R then always exceeds 61.

The stopband in the FIR filter extends from 0.0996 to 0.5 which translates to from $0.1992\pi$ to $\pi$ in terms of the Fourier variable, $\psi'$, corresponding to the FIR input sampling rate $f_z$, where $f_z$ is the decimated sampling frequency: $f_z=f_s/R$. FIG. 5g shows the 0 to $2\pi$ version of $\omega'$ and indicates the symmetry. For negative frequencies, the periodicity shows that the stopband extends from $-\omega$ to $-0.1992\pi$. Thus the outputs from FIR section 320, $w_I(m)$ and $w_Q(m)$, form a complex-valued signal, $w_I+jw_Q$, with spectrum confined to within the band from $-f_z/8$ to $f_z/8$. This confinement to one quarter of the Nyquist frequency follows from the passband plus transition region of FIR section 320 being confined to within the band $-0.1992\pi$ to $+0.19927\pi$. Consequently, the input sampling rate $f_z$ may be decimated by another factor of 4 in FIR filter 320 for separate outputs of the inphase and quadrature signals, $w_I$ and $w_Q$, without loss of information. That is, one FIR filter computation need be done only every four inputs for each of $w_I$ and $w_Q$, and the output sampling rate $f_O$ equals $f_z/4$. A real output can also be generated by a combination of $w_I$ and $w_Q$ and still maintain an effective further deicmation by 4 as described in the FIR Real Output Decimation section below. Thus the minimum decimation rate of 16 in the high decimation filter really provides 64 Clock cylces for generation of a single $w_I$ or $w_Q$ computation.

FIR section 320 consumes the 64 Clock cycles as follows. For simplicity consider RAM 322 as organized as essentially two parallel memories: one memory for the inphase data and one memory for the quadrature data. Then presume that $v_I(m), v_I(m+1), v_I(m+2), \ldots, v_I(m+119), v_I(m+120)$ have been stored in consecutive addresses in the inphase memory and that $v_Q(m), v_Q(m+1), v_Q(m+2), \ldots, v_Q(m+119), v_Q(m+120)$ have been stored in consecutive addresses in the quadrature memory. Two extra inphase samples, $v_I(m-2)$ and $v_I(m-1)$, would arise from the real output considerations described in the FIR Real Output section. With the minimum decimation rate R=16, the FIR section 320 proceeds as follows for complex output using a read/write cycle for the RAM once every 16 clocks in a cycle and thereby read in the data from scaling mulitplier.

| Clock | RAM activity | ROM read |
|---|---|---|
| 0 | read $v_I(m)$ and $v_I(m+120)$ to preadder 325 and write $v_I(m+121)$ to replace $v_I(m)$ read $v_Q(m)$ and $v_Q(m+120)$ to preadder 324 and write $v_Q(m+121)$ to replace $v_Q(m)$ | $c_0$ |
| 1 | read $v_I(m+4)$ and $v_I(m+116)$ to preadder 325, read $v_Q(m+4)$ and $v_Q(m+116)$ to preadder 324 | $c_4$ |
| 2 | read $v_I(m+8)$ and $v_I(m+112)$ to preadder 325, read $v_Q(m+8)$ and $v_Q(m+112)$ to preadder 324 | $c_8$ |
| 3 | read $v_I(m+12)$ and $v_I(m+108)$ to preadder 325, read $v_Q(m+12)$ and $v_Q(m+108)$ to preadder 324 | $c_{12}$ |
| ... | | |
| 15 | read $v_I(m+60)$ and $v_I(m+60)$ to preadder 325, read $v_Q(m+60)$ and $v_Q(m+60)$ to preadder 324 | $c_{60}/2$ |
| 16 | read $v_I(m+1)$ and $v_I(m+119)$ to preadder 325 and write $v_I(m+122)$ to replace $v_I(m+1)$ read $v_Q(m+1)$ and $v_Q(m+119)$ to preadder 324 and write $v_Q(m+122)$ to replace $v_Q(m+1)$ | $c_1$ |
| 17 | read $v_I(m+5)$ and $v_I(m+115)$ to preadder 325, read $v_Q(m+5)$ and $v_Q(m+115)$ to preadder 324 | $c_5$ |
| ... | | |
| 30 | read $v_I(m+57)$ and $v_I(m+63)$ to preadder 325, read $v_Q(m+57)$ and $v_Q(m+63)$ to preadder 324 | $c_{57}$ |
| 31 | idle | ... |

-continued

| Clock | RAM activity | ROM read |
|---|---|---|
| 32 | read $v_I(m+2)$ and $v_I(m+118)$ to preadder 325 and write $v_I(m+123)$ to replace $v_I(m+2)$ read $v_Q(m+2)$ and $v_Q(m+118)$ to preadder 324 and write $v_Q(m+123)$ to replace $v_Q(m+2)$ | $c_2$ |
| 33 | read $v_I(m+6)$ and $v_I(m+114)$ to preadder 325, read $v_Q(m+6)$ and $v_Q(m+114)$ to preadder 324 | $c_6$ |
| ... | | |
| 60 | read $v_I(m+51)$ and $v_I(m+69)$ to preadder 325, read $v_Q(m+51)$ and $v_Q(m+69)$ to preadder 324 | $c_{51}$ |
| 61 | read $v_I(m+55)$ and $v_I(m+65)$ to preadder 325, read $v_Q(m+55)$ and $v_Q(m+65)$ to preadder 324 | $c_{55}$ |
| 62 | read $v_I(m+59)$ and $v_I(m+61)$ to preadder 325, read $v_Q(m+59)$ and $v_Q(m+61)$ to preadder 324 | $c_{59}$ |
| 63 | idle | |
| 64 | read $v_I(m+4)$ and $v_I(m+124)$ to preadder 325, and write $v_I(m+125)$ to replace $v_I(m+4)$ read $v_Q(m+4)$ and $v_Q(m+124)$ to preadder 324 and write $v_Q(m+125)$ to replace $v_Q(m+4)$ | $c_0$ |
| 65 | read $v_I(m+8)$ and $v_I(m+120)$ to preadder 325, read $v_Q(m+8)$ and $v_Q(m+120)$ to preadder 324 | $c_4$ |
| ... | | |

Clock cycles 0 through 62 put the data into multipliers 332–333 to compute $w_I(m)$ and $w_Q(m)$. Similarly, clock cycles 64 through 126 put in the data for computation of $w_I(m+4)$ and $w_Q(m+4)$, and so forth. The address generator may be quite simple by using wraparound addresses in the inphase and the quadrature memories. Here address generator 326 starts with two base addresses separated by 120: the addresses of $v_I(m)$ and $v_I(m+120)$ in the inphase memory. Then successive address pairs arise from incrementing the first address and decrementing the second address until reaching the common address of $v_I(m+60)$. The writes are all read/write cycles and replace the four lowest indexed stored data samples as they are used.

The computation of $w_I(m+4)$ starts by simply incrementing both base addresses by 4 and repeating the cycle. The quadrature memory address generator works similarly, and a single memory with twice the word width could be used. However, for the real output the inphase memory address is offset by 2 for the reads to compute $w_I(m-2), w_I(m+2), \ldots$ rather than $w_I(m), w_I(m+4), \ldots$ and in this case two extra in-phase samples, $v_I(m-2)$ and $v_I(m-1)$ noted previously, will offset the in-phase addresses by 2 because the extra two words for real output are not also stored in the quadrature memory. But the same read/write cycles are used, and of the four new words written in during a 64 clock cycle, only two are read out in the next cycle due to the offset of 2, but all four are read out in subsequent cycles until the last cycle when they are replaced only the two not read in the first cycle are read.

For decimation rates greater than the minimum 16, the inactive status at Clock 63 expands to fill up the extra Clock cycles available with higher decimation rates.

FIR Section—Dual Port RAM

Dual port RAM 322 consists of essentially an in-phase part and a quadrature part. The inphase part stores 123 successive 17-bit $v_I(m)$ outputs of scaling multiplier(s) 318–319 and the quadrature part stores 121 $v_Q(m)$ outputs. Each part has two ports 17 bits wide, so 68 bits (four 17-bit words) are read simultaneously to send to preadders 324–325. However, only one of the ports in each part can be written, and this is the port for the read/write cycles noted in the previous section for writing in data from the scaling multipliers 318–319 every 16 clocks. Details of dual port RAM 322 appear in cross-referenced U.S. Pat. No. 5,449,506.

RAM 322 runs synchronously with Clock, and all actions derive from a rising Clock edge which implies an independence of Clock duty cycle. Further, RAM 322 reads and writes 68 bits simultaneously, so low power sense amplifiers must be used.

FIR Section—Coefficient ROM

ROM 328 supplies the 22-bit FIR filter coefficients $c_j$ to both multipliers 332 and 333 simultaneously. All coefficients have a magnitude of less than ¼, so only 20 physical bits are needed. Details of ROM 328 appear in cross-referenced U.S. Pat. No. 5,440,506.

Two multipliers simultaneously using a coefficient $c_j$ implies that the coefficients can be usefully stored in 30-bit recoded format rather than their 20-bit physical format. This takes up more ROM but eliminates the recoding hardware of both multipliers 332 and 333.

ROM 328 provides low power, high speed access by use of symmetric cell arrays on either side of the differential sense amplifiers as is typical in a RAM rather than the typical single-ended sense amplifier of a ROM. However, a differential sense amplifier requires a differential input which implies a differential reference. ROM 320 generates the differential reference from a folded bitline structure with the differential sense amplifier at the fold and a reference cell on each half bit line.

FIR Real Output Decimation

For a single real output which does not discard information, both $w_I$ and $w_Q$ must be used. Indeed, $w_I$ and $w_Q$ are real and so each has a conjugate symmetric spectrum and thus each has intermingled the information at frequencies $f_C+f_M$ and $f_C-f_M$ from the original sample stream $x(n)$. That is, $f_C+f_M$ and $f_C-f_M$ are complex modulated to $+f_M$ and $-f_M$, respectively, in both $w_I$ and $w_Q$. But a conjugate symmetry spectrum implies that the information at $+f_M$ and is the same as the information at $-f_M$. Hence, the information at $f_C+f_M$ and $f_{C-fM}$ has been intermingled in both $w_I$ and $w_Q$, and both are needed to disentangle the information.

Figure 18:
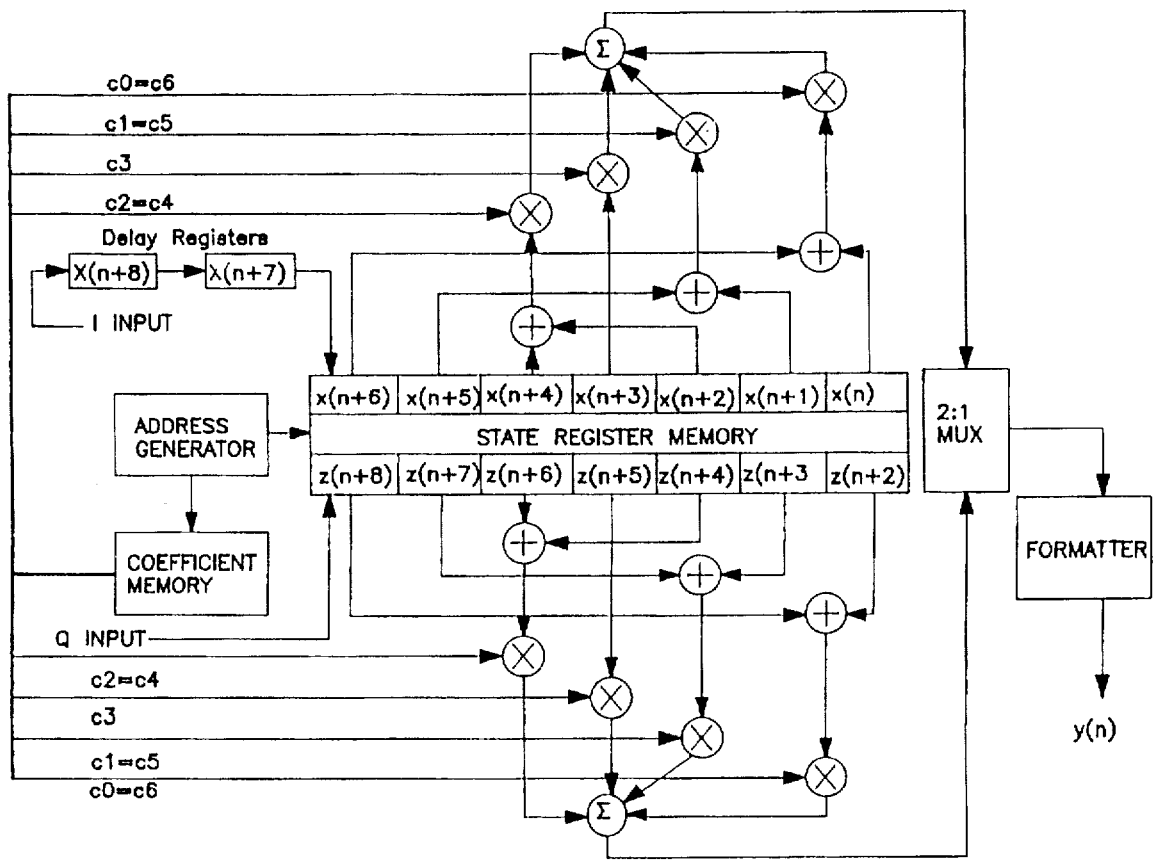
FIG. 18 heuristically shows the FIR filter for real output.

The use of both $w_I$ and $w_Q$ seemingly limits any further decimation of $f_Z$ to a factor of 2 because twice as many samples must be involved for each output as for a single output of $w_I$ or $w_Q$. However, the arrangement of the two branches of the FIR filter 320 as shown in FIG. 18 provides an additional further effective decimation by a factor of 2 as described in cross-referenced Allowed application Ser. No. 930,072. Briefly, this occurs as follows.

Figure 19:
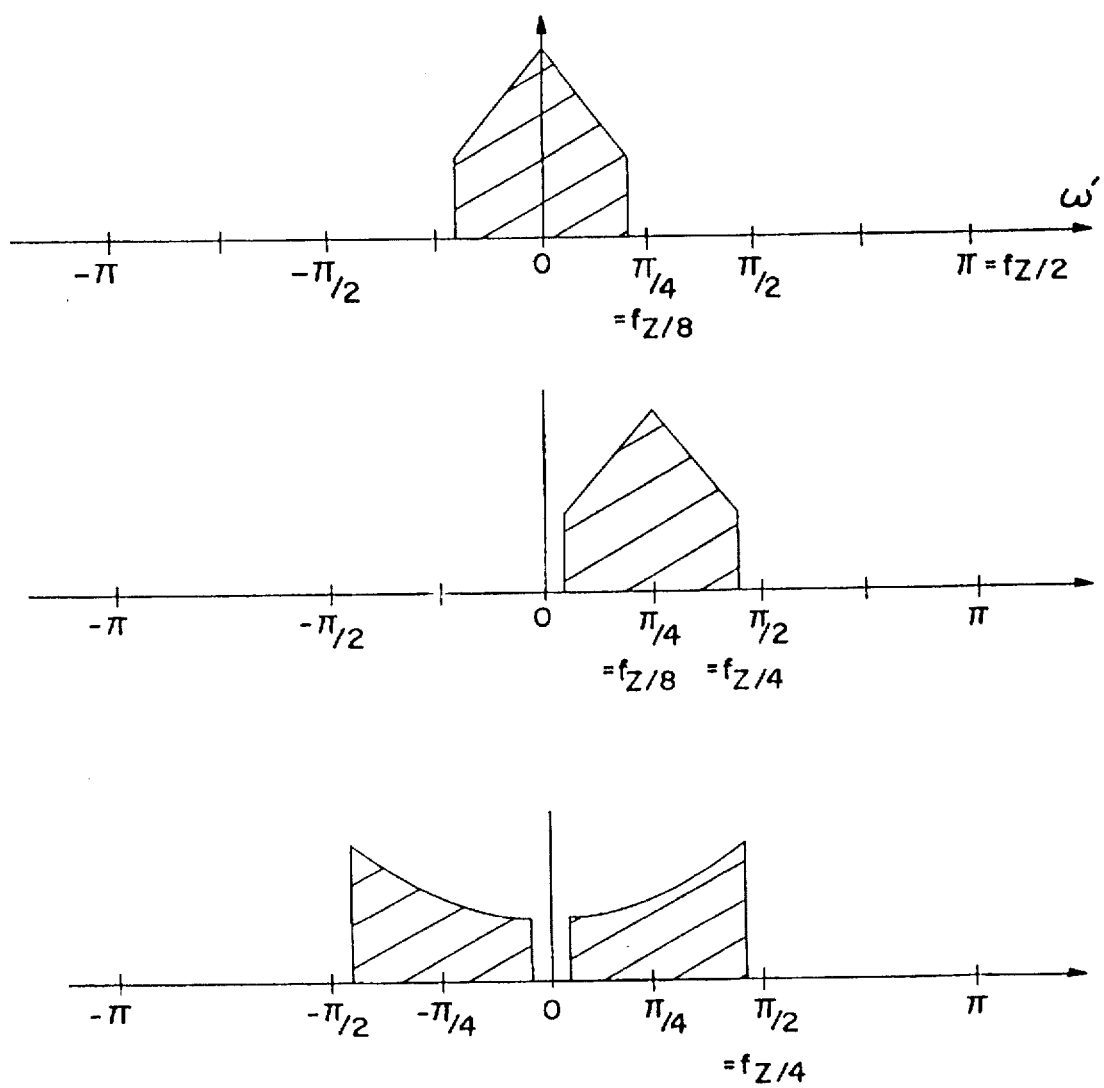
FIG. 19 illustrates the spectra for real output.

The spectrum of $w_I+jw_Q$ lies within $-0.1992\pi$ to $+0.1992\pi$. Hence, an up modulation by $f_Z/8$ moves the spectrum into the range 0 to $f_Z/4$ and thus the resulting sample stream, $$[w_I(m)+jw_Q(m)]\exp(j2\pi mf_Z/8f_Z),$$

is an analytic signal with the real and imaginary parts related by the Hilbert transform. This is related to a Weaver modulation. See FIG. 19 which show the spectra for up modulation. Taking the real part (or the imaginary part) of this analytic signal yields a single real signal without loss of information, and this real signal has a conjugate symmetric spectrum in the range from $-f_Z/4$ to $f_Z/4$. Consequently, a decimation by two of the output may be performed in that only every second output must be computed. That is, a further decimation of sampling rate by a factor of 2.

Furthermore, the exponential equals $\exp(j\pi m/4)$ which is the sequence 1, $e^{j\pi/4}$, j, $e^{j\pi 3/4}$, $-1$, $-e^{j\pi/4}$, $-j$, $-e^{j\pi 3/4}$, 1, $e^{j\pi/4}$, j, ... at the $f_Z$ sampling rate. Thus if only every second output must be computed, just do the computations for the subsequence 1, j, $-1$, $-j$, 1, j, .... Then taking the real part (or imaginary part) is trivial and the output real signal is simply $w_I(0)$, $-w_Q(2)$, $-w_I(4)$, $w_Q(6)$, $w_I(8)$, ... at a $f_Z/2$ sampling rate. That is, the output sampling rate $f_O$ equals $f_Z/2$. This provides the additional effective decimation factor of 2 because the output single real data stream contains all of the information of the complex output of both $w_I$ and $w_Q$.

This up modulation by $f_Z/8$ (one quarter of the output sampling frequency) to obtain a real output does not shift the frequencies of the original input, but effectively just exchanges sines and cosines. Recall that the original complex modulation by $f_C$ and filtering obliterated the distinction between original sines and cosines because only the original positive (or only the original negative) frequencies survive the filtering. Thus the up conversion can yield either a sine or cosine as the real output, the difference only one of phase.

The computations of $w_I$ and $w_Q$ use the same coefficients in ROM 328, and the simplified FIR filter branch arrangement of FIG. 18 takes advantage of this. In particular, the output real signal has $w_Q(m+2)$ following $w_I(m)$, so the inphase inputs $v_I$, are delayed by two words in registers or by offset memory addresses as previously described. Then the fetch of a coefficient $c_j$; from ROM 328 can be simultaneously sent to both multipliers 332 and 333 to simultaneously multiply the preadded $v_I(m+j)+v_I(m+120-j)$ and $v_Q(m+2+j)+v_Q(m+122-j)$ sums and thereby simultaneously form the two partial products to accumulate in the corresponding accumulators 334 and 335. The output real signal then derives simply from time multiplexing the accumulators' contents in multiplexer 358. And the minus sign for alternating ones of $w_I$ and alternating ones of $w_Q$ may be effected by simply complementing the values.

Note that the input data is treated as numbers of magnitude at most 1, so the output of decimation filter 310 has two's complement format with the most significant bit as the coefficient of $2^{-1}$ and the least significant bit as the coefficient of $2^{-17}$. The output of the scaling multiplier(s) 318–319 also has two's complement format but with the most significant bit as the coefficient of $2^{-1}$ and the least significant bit the coefficient of $2^{-16}$. Preadders then output numbers in two's complement format with the most significant bit as the coefficient of $2^0$ and least significant bit as coefficient of $2^{-16}$. FIR filter coefficients have 20 physical bits of two's complement format where with most significant bit as the coefficient of $2^{-3}$ and least significant bit as coefficient of $2^{-21}$. Thus the products of FIR coefficients with preadded data words have two's complement format with the most significant bit as the coefficient of $2^{-2}$ and the least significant bit the coefficient of $2^{-37}$. These products are accumulated and the sum has two's complement format with the most significant bit as the coefficient of $2^{-1}$ and the least significant bit the coefficient of $2^{-37}$. That is, the largest number is 0.1111 . . . and the smallest (most negative) number is $-1.0000$ . . . This is consistent with a gain 1 filter. A 39th bit could be used in accumulators 334–335 to insure no overflow, but note that the FIR coefficients have roughly sin (x)/x relative sizes and the accumulation of products begins with the small tail coefficients and accumulates towards the largest positive terms.

Formatter

Figure 20:
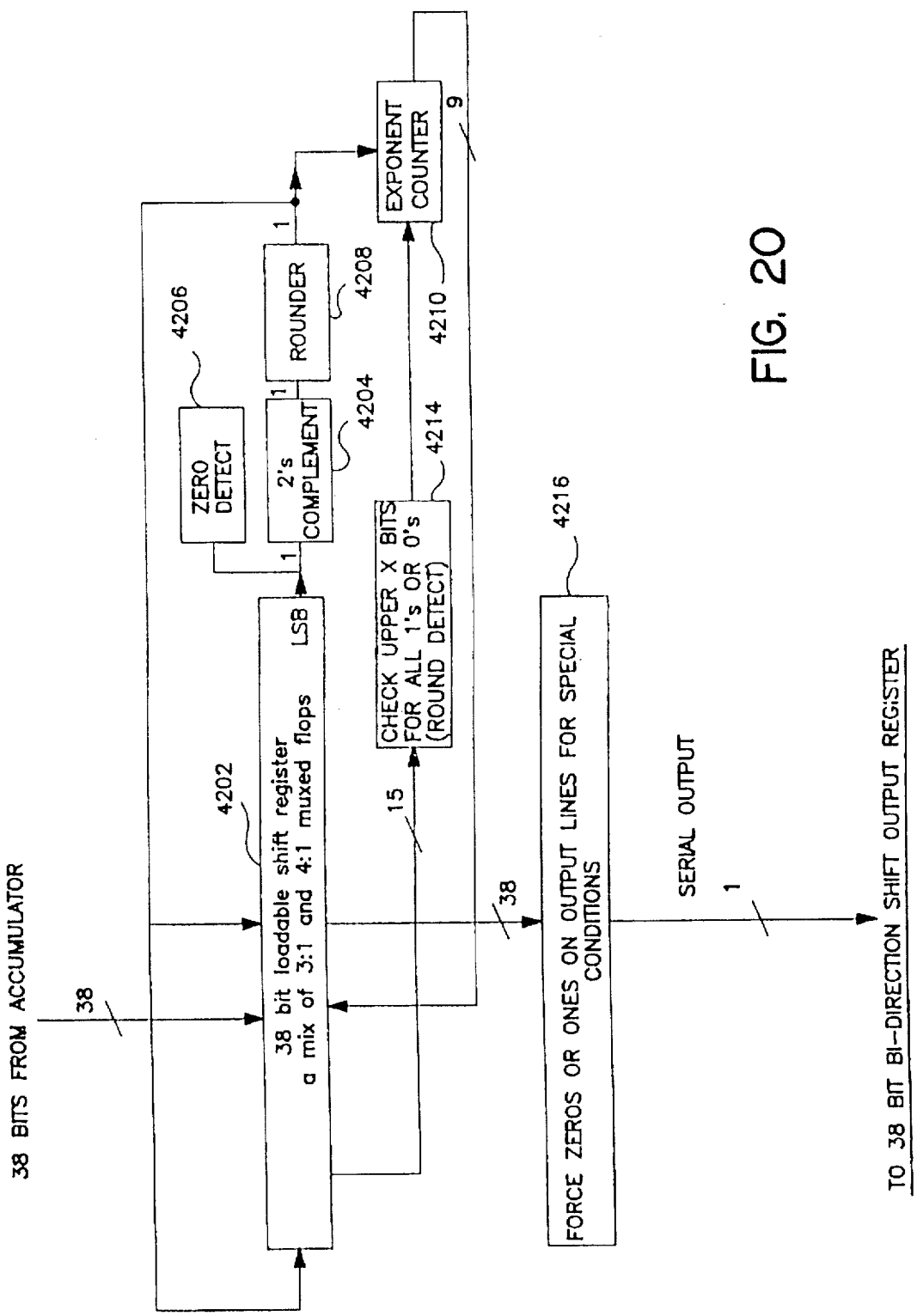

FIG. 20 shows in block form each of formatters 340–341 including 38-bit shift register 4202, zero detector 4206, two's complementer 4204, rounder 4208, fixed-to-floating exponent counter 4210, round detector 4214, and special condition bit forcer 4216. Formatters 340–341 output 38-bit two's complement data by simply passing the output received from accumulators 334–335 in parallel through shift register 4202 and out to shift registers 356–357 shown in FIG. 3. For 32-bit or 24-bit or 16-bit two's complement data, formatters 340–341 shift the 38-bit data out of shift register 4202 one bit at a time through two's complementer 4204 without complementing then LSB first through rounder 4208 and back into shift register 4202, the sign bit (bit 37) is not shifted. Then the rounded data is output in parallel to shift registers 356–357. The most positive number (0111 ... 111) presents a wraparound problem for rounding which otherwise simply adds a 1 at the bit position one less significant than the rounded bit position and truncates. Zero detector 4206 spots this case and special condition bit forcer 4216 outputs the most positive number. Formatters 340–341 output sign-magnitude format data by shifting the data out of shift register 4202 one bit at a time through two's complementer 4204 and back into shift register 4202. Data is complemented only if it was negative. The sign bit is fixed by additional logic. For floating point output, formatters 340–341 proceed as follows.

The IEEE standard for single precision floating point binary numbers has a 32-bit format with a sign bit followed by 8 offset exponent bits (leading MSB) which are then followed by 23 magnitude bits (leading MSB) but with an implicit leading 1. That is, the exponent is defined as the 8 exponent bits minus 127, and the 23 magnitude bits represent a number x−1 where $1 \leq x < 2$. Thus if E is the number defined by the exponent bits and F the number defined by the 23 bits, the floating point number is $(-1)^S 2^{E-127}(1.F)$ where S is the sign bit. However, if E and F are both 0, then the floating point number is 0. The conversion steps are basically:

(1) convert to sign magnitude (if negative sign, then save sign and do two's complement);
(2) normalize;
(3) round to 24 bits;
(4) renormalize;
(5) check results.

Figures 21, 22:
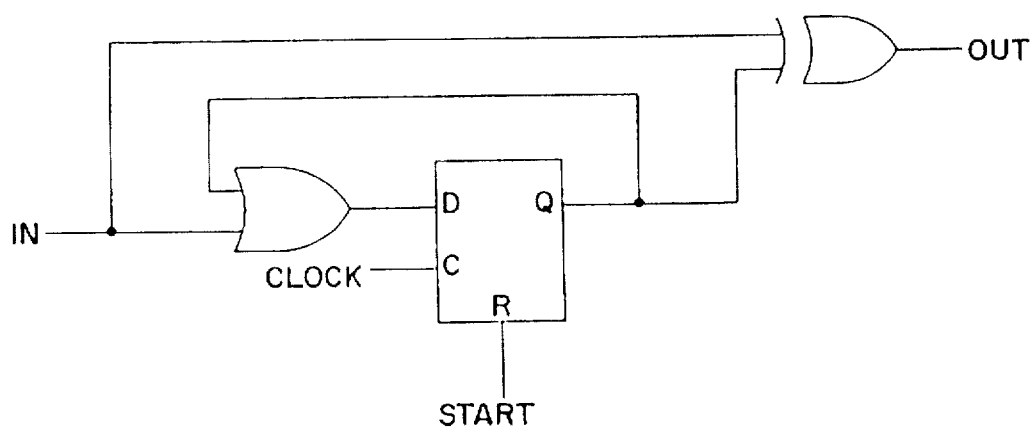

Steps (2) and (4) are typically MSB to LSB operations, but steps (1) and (3) are LSB to MSB operations. And all operations must be done within 64 Clock cycles because this is the minimum overall decimation rate. The structure of FIG. 20 minimizes hardware by a serial approach rather than a parallel approach and squeezes all of the operations into 64 Clock cycles. In particular, the two's complement for step (1) may be simply performed with the serial complementer shown in FIG. 21. The output has one more bit than the input to allow a complementing of the most negative number. Additions proceed from LSB to MSB. The shifting out of the 37 magnitude bits requires 37 Clock cycles and the complementer adds one more Clock cycle as does the rounder.

The normalization step (2) proceeds from LSB to MSB as the bits emerge from rounder 4208 as follows: on each detected 1, exponent counter 4210 has 127 loaded in, and on each detected 0, counter 4210 is decremented by 1. Thus when the 37 bits have been shifted out of format shift register 4202 through two's complementer 4204 and rounder 4208 and 24 bits have been shifted back into format shift register 4202, counter 4210 contains the proper exponent. That is, this LSB first approach guesses that each arriving 1 is the most significant 1 and decrements on each successive 0 to count how many places the most significant 1 was from the $2^0$ bit. The exponent is loaded in parallel into bit positions 32–25 of format register 4202.

After the data word has been rounded to 24 bits and the exponent determined by counter 4210, renormalization step (4) proceeds by circular shifting of the 24 rounded bits in format register 4202; recall the implicit leading 1, so the most significant 1 bit is discarded.

Round detector 4214 checks the data word when initially loaded into format shift register 4202 to see if bits 37 (sign bit) through 24 are all equal; if yes, then the data word has magnitude of less than 24 bits and rounding is inhibited.

Lastly, formatters 340–341 provide upconversion by frequency $f_C/2$ simply using the two's complementer on alternating $w_I$ and $w_Q$ to yield the alternating signs required in the case of quadrature output.

Control

Converter 300 accepts one or more 40-bit serial control words at input terminal Control Data The seven defined control words are shown in FIGS. 22–29 and provide for configuration of converter 300. Control Clock serially clocks one or more control words into double buffered control shift register 350 when Control Strobe is high; see FIG. 6. The control words are transmitted with bit 39, the most significant bit (MSB), first. Bits 39–37 identify the control word type. Bit 36=1 causes the control word to be loaded into a control buffer register and all control registers will be updated from their respective control buffer registers. The Converter 300 update will take effect upon the next internal chip interrogation of the command/control register 350. If bit 36=0, then only the control buffer register is updated. Control Decoder 352 decodes the control words and sends parameters and commands to registers in the various blocks over bus 362.

Figure 30:
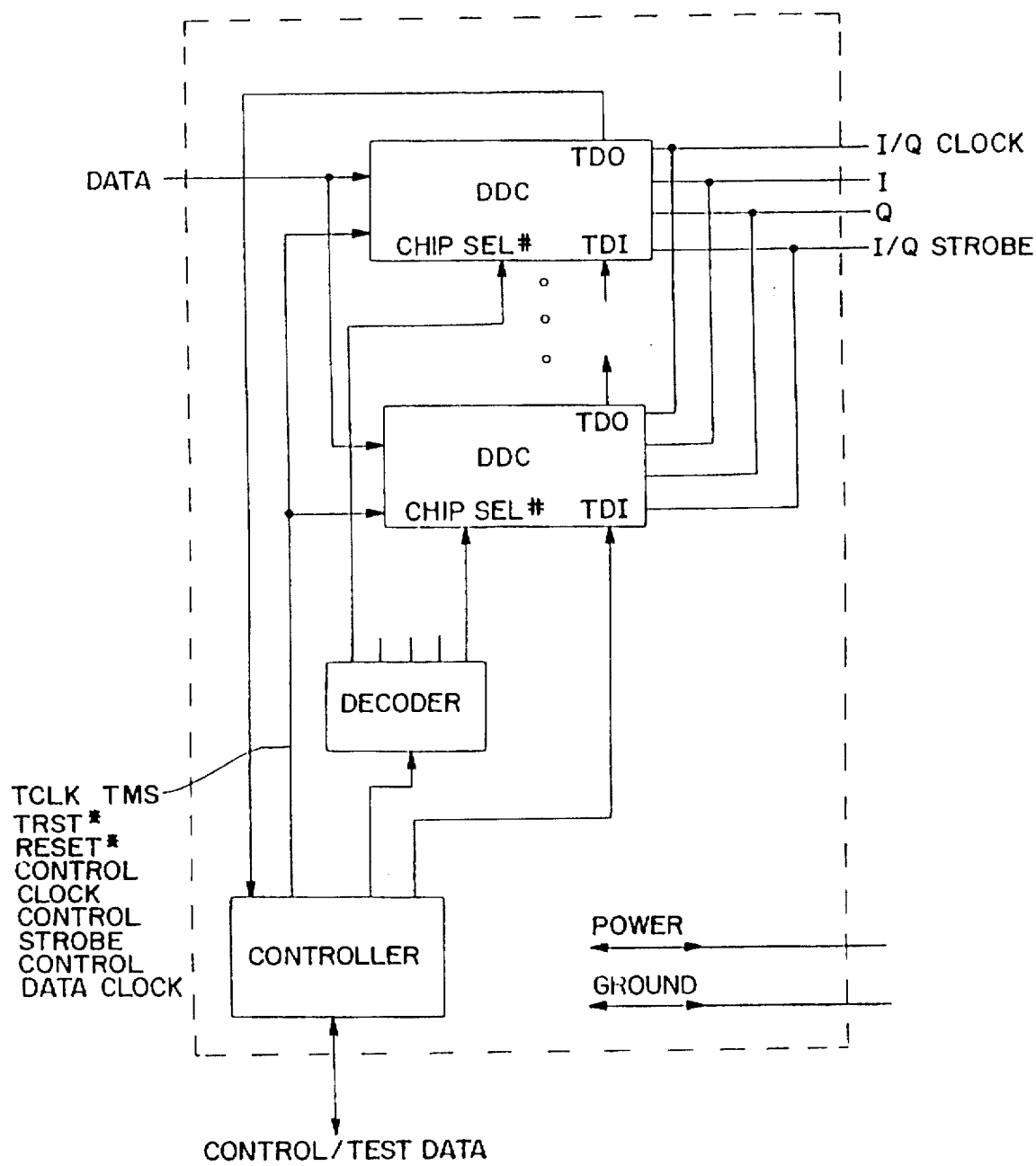
FIG. 30 illustrates a multichip module.

The serial control input, on-chip testing, and the auto-tri-state output with reset delay of converter 300 make multi-chip modules practical. Multichip modules package two or more silicon dice together using within-package bond wiring to both interconnect the dice and make connections from the dice to the package pins. FIG. 30 heuristically shows a multichip module with multiple converter 300 dice. All lines are common to all dice except the test port, chip enable, and I/Q enable. The controller permits isolation of each die for testing and control word loading. On-chip testing is necessary due to the impractically large number of test patterns required to do any meaningful testing based on input/output only. The individual components of each die can be isolated and tested with controller selecting one chip at a time.

The use of serial control lines keeps the number of wire bonds and controller logic inside the multichip module package within practical size. Multichip modules demand simple and limited control among the dice and a regular structure to simplify control and wiring. If the dice employed parallel control word loading, then a bus internal to the multichip module would be needed.

Further, serial output implies only three or four wires (clock, 1–2 data, and strobe) instead of the 38 or 76 wires for parallel output of the accumulators 334–335. The serial output has higher average power dissipation, but the instantaneous power dissipation of the parallel output is much higher than that of the serial output.

Control Word 5 has the Auto-tri-State enable commands. With auto-tri-state enabled the output drivers of each converter are only active when data is being output and for 1 Clock cycle preceding and following data output. See FIG. 7a. Control Word 5 also permits a selection of a reset delay of 0 to 63 words for the output. That is, each converter has a independently programmed delay which is inserted between the availability of I or Q data for output and the actual output. Thus up to sixty-four converter dice can be incorporated into the multichip module of FIG. 30 and use differing reset delays plus enabled auto-tri-state to time multiplex their outputs without any additional circuitry.

Test

In applications of converter 300 where the I output is the only data output required, the Q output can be used as a test output. Control Word 1 bit 3 equal to a 1 enables the test features controlled by Control Word 7. Control Word 7 allows the circuit to force the Input Data; force the outputs; bypass the Phase Generator, HDF Integrator, HDF Decimater, HDF Comb, Scaler Multiplier, RAM, and FIR multiplier; configure the FIR Accumulator to: accumulate normally, continuously, never or act as a signature register; and generate an I/Q Strobe normally or only when the Phase Accumulator rolls over. The chip also has an IEEE1149.1 Test Access Port, (TAP). Refer to IEEE Std 1149.1–1990 IEEE Standard Test Access Port and Boundary-Scan Architecture for exact requirements. The TAP supports the following instructions: BYPASS, SAMPLE/PRELOAD, INTEST, EXTEST, RUNBIST, IDCODE, AND USERCODE. These test controls allow the chip to be tested efficiently during factory and board level testing.

High Decimation Filter Mode

The high decimation filter mode allows converter 300 to be operated as a single high decimation filter. This mode is selected by setting bits 2–0 of Control Word 1 to 111. In effect, phase generator 308 is bypassed so the samples x(n) feed directly into decimation filter section 310. Alternatively, selecting the phase offset and minimum phase increment both 0 in nonchirp mode causes phase generator 308 to send a constant phase angle of 0 to sin/cos generator 306. In this case the samples x(n) pass through the inphase branch (multiplier 305) unchanged and are zeroed in the quadrature branch (multiplier 304).

Decimation filter section 310 requires a minimum decimation rate of 16 to allow sufficient time for the fixed decimate-by-four FIR to compute its response. Therefore, this mode of operation implements a filter which has a maximum decimation rate of 131,072 and a minimum decimation rate of 64.

Reset

The reset function for converter 300 is provided as an external low active input, Reset#. This function allows the chip to be initialized and synchronized. Control Word 5 contains the Reset Delay programming bits. The Reset Delay allows the output to be held from 0 to 63 output word times before being transmitted. This delay allows up to 64 chips to be multiplexed using the Auto-Tri-State Enable feature while utilizing a common Reset# pulse for synchronization. If the Reset# signal is deasserted $T_{RR}$ nanoseconds prior to the rising edge of Clock, reset will occur synchronously. If $T_{RR}$ is violated, then the converter 300 contains a synchronizer which will cause reset to be de-asserted internally one or more clocks later. Reset# assertion causes the I/Q Output Clock, I/Q Strobe, I, and Q outputs to become high impedance and all the control registers to be updated from their respective control buffer registers upon reset de-assertion.

Fabrication

Converter 300 may be fabricated with any convenient discrete or integrated circuit materials and processing methods. In particular, CMOS processing of silicon provides high packing density and low power. The line width can be varied over a wide range, various CMOS processes such as metal, polysilicon or polycide gate, n-well, twin well, silicon-on-insulator, and so forth could be used. Also, BiCMOS processes could be used for faster operation and greater drive currents than with comparably-sized CMOS processes.

Modificastions anf Variations

The preferred mebodiments may be varied in many ways while preserving features such as the overall down converter operation with control words and bypassable portions, a scaling multiplier for decimation filter gain compensation, phase generation alternatives, format alternatives, and converter array usage with reset delays and auto tri state outputs. For example, the FIR section 320 could have a single preadder, multiplier, and accumulator and just interleave the in-phase and quadrature data stream computations, this could use a single scaling multiplier with multiplexed outputs from the high decimation filters; the number of bits in a word at various stages could be varied provided sufficient sampling rate decimation occured to allow for serial operations where used, or the decimation minimum could be relaxed in conjunction with parallel arithmetic hardware; the auto tri state reset delay could also be used when the output is parallel rather than serial; and so forth.

What is claimed is:

1. A system for controlling data on a data bus comprising:
   a system clock means; and
   at least one data bus driving means for controlling data on the data bus, the data bus driving means:
   (i) being in a tristate condition during a first period of time,
   (ii) causing the data bus to be in a first level of potential during a second period of time,
   (iii) causing the data to be transmitted on the data bus during a third period of time,
   (iv) causing the data bus to be in a second level of potential during a fourth period of time, and
   (v) causing the data bus driving means to return to a tristate condition during a fifth period of time.

2. The system of claim 1 wherein the first and second levels of potential are substantially equal to each other.

3. The system of claim 1 further comprising:
   a means for providing a system reset, the system reset resetting the bus drive means at the beginning of the first time period.

4. The system of claim 3 wherein:
   the system clock further defines system time slots and
   the system time slots further define first, second, third, fourth, and fifth periods of time.

5. A programmable system having a data bus comprising:
   a plurality of data bus driving means for controlling data on the data bus, the data bus driving means:
   (i) being in a tristate condition during a first period of time,
   (ii) causing the data bus to be in a first level of potential during a second period of time,
   (iii) causing the data to be transmitted on the data bus during a third period of time,
   (iv) causing the data bus to be in a second level of potential during a fourth period of time, and
   (v) causing the driving means to return to a tristate condition during a fifth period of time;
   a plurality of data apparatus for inputting and outputting data on the data bus during the third period of time;

a means for providing a system clock, the system clock defining the first, second, third, fourth, and fifth periods;

a means for providing an output clock;

a means for providing system time slots; and a means for providing a system reset, the system reset resetting the bus driving means at a beginning of the first time period.

6. The programmable system of claim 5 further comprising a programmable strobe for indicating the transmission of data wherein said strobe may selectively occur at one of either just prior to data transmission and during data transmission.

7. The programmable system of claim 5 wherein:

the data is divided into bits and the number of data bits is programmable and the number of time slots is programmable.

8. The programmable system of claim 5 wherein the means for providing an output clock is programmable and defines an output clock rate.

9. The programmable system of claim 5 wherein the system clock, system reset, and the system time slots define the times when a data bus driving means can control the state of the data bus.

10. The programmable system of claim 5 wherein the second, third, and fourth periods define a sub-clock for a time slot.

11. The programmable system of claim 5 wherein each of the data bus driving means is assigned a unique time slot.

12. The programmable system of claim 5 wherein:

the time slots are divided into N sequential and repeating time slots, and the system reset means uniquely identifies one of the N time slots.

* * * * *